(12) United States Patent
Song et al.

(10) Patent No.: US 10,181,410 B2
(45) Date of Patent: Jan. 15, 2019

(54) INTEGRATED CIRCUIT PACKAGE COMPRISING SURFACE CAPACITOR AND GROUND PLANE

(71) Applicant: QUALCOMM Incorporated, San Diego, CA (US)

(72) Inventors: Young Kyu Song, San Diego, CA (US); Kyu-Pyung Hwang, Newton, MA (US); Hong Bok We, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 379 days.

(21) Appl. No.: 14/634,547

(22) Filed: Feb. 27, 2015

(65) Prior Publication Data

US 2017/0125332 A1 May 4, 2017

(51) Int. Cl.
*H01G 4/12* (2006.01)
*H01G 4/224* (2006.01)
(Continued)

(52) U.S. Cl.
CPC .... *H01L 21/4857* (2013.01); *H01L 23/49822* (2013.01); *H01L 23/49827* (2013.01); *H01L 24/17* (2013.01); *H01L 24/32* (2013.01); *H01L 24/73* (2013.01); *H01L 24/81* (2013.01); *H01L 24/83* (2013.01); *H01L 24/92* (2013.01); *H01G 4/12* (2013.01); *H01G 4/224* (2013.01); *H01L 23/49838* (2013.01); *H01L 23/49894* (2013.01); *H01L 2224/0345* (2013.01); *H01L 2224/0401* (2013.01); *H01L 2224/1132* (2013.01); *H01L 2224/11462* (2013.01); *H01L 2224/11464* (2013.01); *H01L 2224/11849* (2013.01); *H01L 2224/13014* (2013.01); *H01L 2224/13016* (2013.01); *H01L 2224/13111* (2013.01);
(Continued)

(58) Field of Classification Search
CPC ......... H01L 23/49827; H01L 23/49838; H01L 23/49822
See application file for complete search history.

(56) References Cited

U.S. PATENT DOCUMENTS 6,927,125 B2 * 8/2005 Jones .................. H01L 27/0805
257/E21.019
7,091,607 B2 8/2006 Liu et al.
(Continued)

*Primary Examiner* — Amar Movva
(74) *Attorney, Agent, or Firm* — Loza & Loza, LLP/Qualcomm

(57) ABSTRACT

Many aspects of an improved IC package are disclosed herein. The improved IC package exhibits low-impedance and high power and signal integrity. The improved IC package comprises an IC die mounted on a multilayer coreless substrate. The thicknesses of prepreg layers of the coreless substrate are specific chosen to minimize warpage and to provide good mechanical performance. Each of the prepreg layers may have different coefficient of thermal expansion (CTE) and/or thickness to enable better control of the coreless substrate mechanical properties. The improved IC package also includes a vertically mounted die side capacitor and a conductive layer formed on the solder resist layer of the substrate. The conductive layer is formed such that it also encapsulates the vertically mounted capacitor while being electrically coupled to one of the capacitor's electrode.

18 Claims, 22 Drawing Sheets

(51) Int. Cl.
*H01L 21/48* (2006.01)
*H01L 23/00* (2006.01)
*H01L 23/498* (2006.01)

(52) U.S. Cl.
CPC ............... *H01L 2224/13116* (2013.01); *H01L 2224/13147* (2013.01); *H01L 2224/16113* (2013.01); *H01L 2224/16227* (2013.01); *H01L 2224/32225* (2013.01); *H01L 2224/73204* (2013.01); *H01L 2224/81191* (2013.01); *H01L 2224/83192* (2013.01); *H01L 2224/9211* (2013.01); *H01L 2924/01022* (2013.01); *H01L 2924/01074* (2013.01); *H01L 2924/14* (2013.01); *H01L 2924/15311* (2013.01); *H01L 2924/15747* (2013.01); *H01L 2924/15763* (2013.01); *H01L 2924/19041* (2013.01); *H01L 2924/19105* (2013.01); *H01L 2924/2064* (2013.01); *H01L 2924/20641* (2013.01); *H01L 2924/3511* (2013.01)

(56) References Cited

U.S. PATENT DOCUMENTS

| | | | |
|---|---|---|---|
| 7,875,973 | B2 | 1/2011 | Chiu |
| 7,884,470 | B2 | 2/2011 | Cheah et al. |
| 2002/0127795 | A1* | 9/2002 | Shih ............... H01L 27/1087 438/243 |
| 2007/0071052 | A1* | 3/2007 | Hommel ............ H01L 21/76838 372/46.012 |
| 2014/0054773 | A1* | 2/2014 | Kurashima ........... H01L 21/565 257/738 |
| 2014/0084437 | A1 | 3/2014 | Yamada et al. |
| 2014/0091428 | A1 | 4/2014 | Hossain et al. |

* cited by examiner

INTEGRATED CIRCUIT PACKAGE COMPRISING SURFACE CAPACITOR AND GROUND PLANE

BACKGROUND

Field

The disclosure relates to an integrated circuit package and method for fabricating a coreless substrate integrated circuit (IC) package with die side capacitors and a conductive layer.

Background

As electronic devices are getting smaller and faster, the demand for integrated circuit (IC) packages with higher I/O count, faster data processing rate, and better signal integrity greatly increases. Today packaging technologies such as wire bond lead-frame and conventional ball grid array (BGA) are not suitable for the high speed and data demands of ultra-thin and small electronic devices (e.g., smart watch, smart glasses, etc.).

The performance of integrated circuits in high performance electronic devices highly depends on the ICs' power delivery/distribution network (PDN). The impedance of the PDN can greatly affect the signal integrity (SI) of the overall IC. Specifically, the overall impedance from ground & power planes location, length of metal traces, number of vias and bumps, etc., can greatly impact the electrical performance.

The thickness (z-height) of an IC package can also affect the electrical performance of an IC. In particular, the thickness of an IC substrate is highly correlated with parasitic capacitance, inductance, and resistance, all of which affect the electrical performance of the system. Accordingly, what is needed is an improved IC package having a smaller z-height and an improved SI and PDN.

SUMMARY

Many aspects of an improved IC package are disclosed herein. The improved IC package exhibits low-impedance, high signal integrity, and high power integrity. On a high level, the improved IC package comprises an IC die mounted on a multilayer substrate (e.g., coreless substrate). The thicknesses of prepreg layers of the substrate are specific chosen to minimize warpage and to provide good mechanical performance. Each of the prepreg layers may have different coefficient of thermal expansion (CTE) and/or thickness to enable better control of the cureless substrate mechanical properties. The improved IC package also includes a vertically mounted die side capacitor and a conductive layer formed on the solder resist layer of the substrate. The conductive layer is formed such that it also encapsulates the vertically mounted capacitor while being electrically coupled to one of the capacitor's electrode.

Further detail of the improved integrated circuit is provided below. The IC package includes; an integrated circuit die coupled to a first plurality of substrate pads embedded in a first layer of a substrate; a vertical capacitor having a first electrode coupled to a first substrate pad embedded in the first layer of the substrate; and a conductive layer formed on the first surface and a second electrode of the vertical capacitor, wherein the conductive layer encapsulates the vertical capacitor, and wherein a common axis of the first and second electrodes is perpendicular to a planar surface of the substrate.

In one aspect, the conductive layer is coupled to at least one substrate pad embedded in the first layer of the substrate. The first layer of the substrate may be an outer most passivation layer or a solder resist layer. In the IC package, the substrate comprises: a first and a second prepreg layers; a first metal layer located on the first prepreg layer, wherein each substrate pad embedded in the first layer of the substrate is formed on the first metal layer, wherein the first layer of the substrate is a solder resist layer; a second metal layer located between the first and second prepreg layers; a third metal layer located on a surface of the second prepreg layers; and a second solder resist layer located on the third metal layer.

The first and second prepreg layers of the substrate may have a thickness range of 30-60 microns. In one aspect, each of the first and second prepreg layers has a thickness of 45 microns. The first and second prepreg layers may also have different thicknesses to reduce warpage. For example, the first prepreg layer may have a thickness of 30 microns and the second bottom prepreg layer may have a thickness of 60 microns. Additionally, each of the first and second prepreg layers may have a different coefficient of thermal expansion (CTE). In this way, warpage of the entire IC package may be reduced by encouraging warpage of the substrate in the opposite direction of the normal warpage profile.

In one aspect, the conductive layer is coupled to a second and third substrate pads, wherein the second substrate pad is electrically coupled to the integrated circuit die via a conductive trace in the first metal layer. The second substrate pad may be coupled to a ground or a power source.

The thickness of the substrate may have a range of 160-190 microns. In one aspect, the thickness of the substrate is 176 microns.

The die side capacitor (DSC) may be a multilayer ceramic capacitor with vertical interleaved metal layers. The DSC may have a width of 0.5 millimeter and a thickness range of 0.1-0.2 millimeter. Additionally, the DSC may have a layer of resistance control material deposited on the outside of each of the electrodes of the DSC.

In yet another aspect, a method for manufacturing an integrated circuit package is provided. The method includes: providing a substrate having a plurality of build-up layers; providing a vertical capacitor; attaching a first electrode of the vertical capacitor to a first substrate pad embedded in a first layer of the plurality of build-up layers of the substrate; and forming a conductive layer on a portion of the first layer of the plurality of build-up layers of the substrate and on a second electrode of the vertical capacitor, wherein the conductive layer encapsulates the vertical capacitor; and attaching an integrated circuit die to a first plurality of substrate pads embedded in the first layer of the substrate.

In yet another aspect, the IC package includes: a coreless substrate having a plurality of build-up layers; an integrated circuit die coupled to a first plurality of substrate pads embedded in a first layer of the plurality of build-up layers of the substrate; a vertical capacitor having a first and a second electrodes with a common axis being perpendicular to a planar surface of the substrate, the first electrode is coupled to a first substrate pad embedded in the first layer of the substrate; and a conductive layer formed on the first surface and the second electrode of the vertical capacitor, wherein the conductive layer encapsulates the vertical capacitor, wherein the plurality of build-up layers comprise two prepreg layers, and wherein each prepreg layer has a thickness range of 30-60 microns.

BRIEF DESCRIPTION OF THE DRAWINGS

The foregoing summary, as well as the following detailed description, is better understood when read in conjunction with the accompanying drawings. The accompanying drawings, which are incorporated herein and form part of the specification, illustrate a plurality of embodiments and, together with the description, further serve to explain the principles involved and to enable a person skilled in the relevant art(s) to make and use the disclosed technologies.

DETAILED DESCRIPTION

In the following description numerous specific details are set forth in order to provide a thorough understanding of the invention. However, one skilled in the art would recognize that the invention might be practiced without these specific details. In other instances, well known methods, procedures, and/or components have not been described in detail so as not to unnecessarily obscure aspects of the invention.

Overview

Due to high pin count and good electrical performance, flip chip packaging is widely used in high performance devices. Flip chip packaging is commonly used with multilayered or build-up cored substrates. In traditional application, build-up substrates used in a flip chip package may have 6 to 12 layers. The core layer thickness of these substrates may range between 200-800 microns. The demands for high performance devices have pushed for the development of substrate with even thinner core layer. Current substrate fabrication technologies can now produce substrates with a core layer thickness of 100 microns. Lower core thickness is necessary to increase the device's operating frequency and electrical performance.

As the core layer becomes thinner, the natural progression of substrate technology is to fully transition to coreless substrates. Coreless substrates have several advantages over cored substrates. Some of those advantages are lower parasitic resistance, inductance, and capacitance as interconnects or traces are tighter and shorter due to the decrease in distance between the various layers. Coreless substrates have very low z-height and allow for higher I/O density. However, without a core layer, a aweless substrate is more prone to warpage. One of the main reasons is that the materials used in the core layer of a substrate have much higher Young's modulus (stiffness) than materials used in prepreg layers of a coreless substrate.

Even though the electrical performance of a coreless substrate is generally better than a cored substrate, the design of the power delivery network cannot ignored. To achieve a low-impedance, high signal integrity, low switching noise, and stable power supply, carefully consideration must be placed on the design of the power delivery network such as the location of the ground plane and capacitors, for example. To better illustrate the innovations made in the present disclosure, some different IC package technologies will be discussed.

IC Package With Cored Substrate

Figure 1:
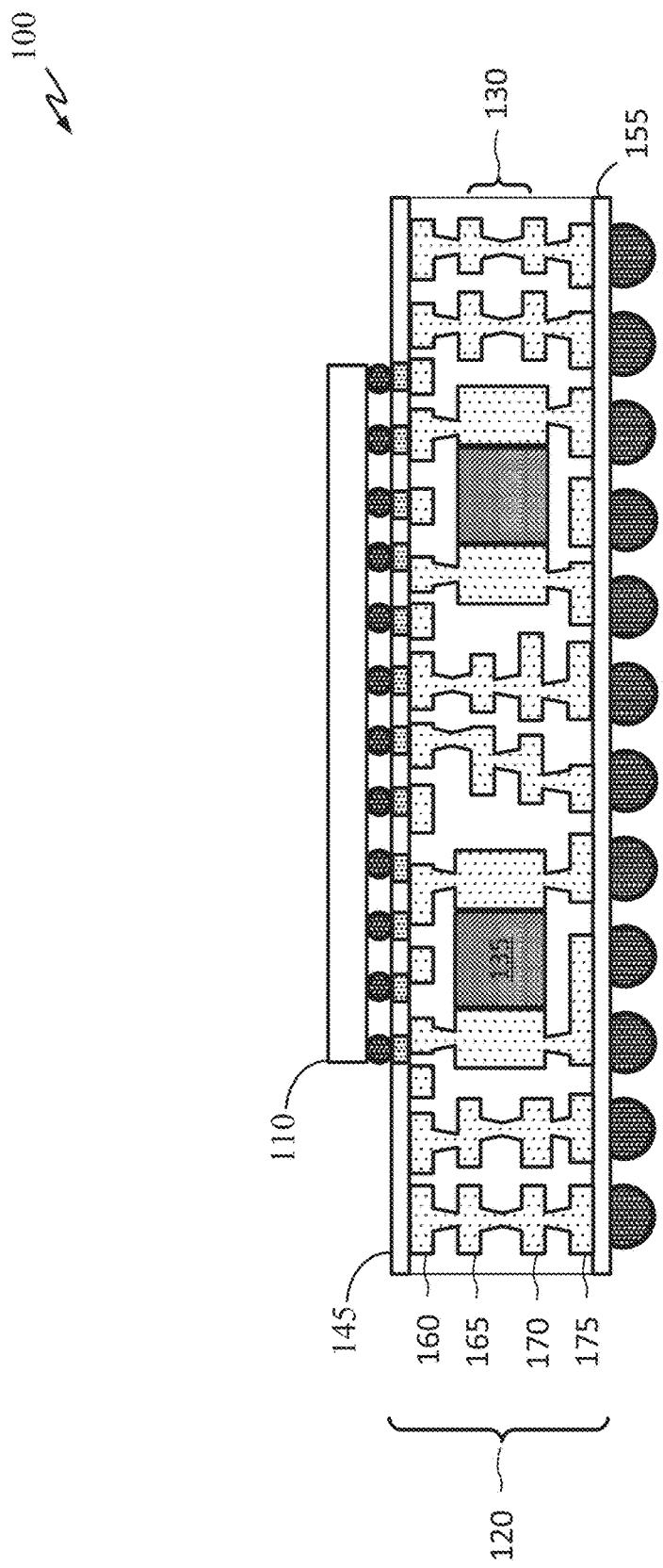
FIG. 1 illustrates a integrated circuit (IC) package with a cored substrate and embedded passive components.

FIG. 1 illustrates a flip chip IC package 100. The IC package 100 includes an IC die 110 that is bonded to a substrate 120 with the I/O surface facing down toward the substrate (hence the name flip chip). The flip chip packaging method is one of the two the most commonly used chip-to-substrate bonding methods. The other method is the wire bond method. Rather than using wires to connect I/Os of the die to the substrate, the flip chip packaging method uses conductive bumps (often made of solder) to directly connect the IC die 110 to an IC substrate or board. This configuration enables bumps to be placed in an area-array on substantially the entire surface of die 110. Whereas, the wire bond method only allows an array of I/Os on the peripheral of the die.

Other than a higher I/O count, a flip chip IC package is generally advantageous over a wire bond IC package because of better electrical performance (i.e., lower parasitic inductance and capacitance) and smaller form factor. Additionally, the flip chip bonding technology is also well suited for chip scale packaging (CSP) where the overall physical size of the IC package is near the chip size. (Per the Association Connecting Electronic Industries (IPC), an IC CSP package must not be 1.2 time larger than the size of the chip.) Because of its small form factor, FCCSP (flip chip chip scale packaging) are often used in baseband processors in high end consumer electronic devices. It should be noted that flip chip packaging can also be used with ball grid may (BGA) and micro BGA substrates and/or printed wire boards (PWB).

As shown in FIG. 1, IC package 100 includes multiple metal layers 160-175 and an embedded passive device 150 such as a capacitor. The metal layers 160 and 175 serve as the redistribution layers of substrate 120, which route conductor pattern and reroute interlayer via connections to other areas of the substrate. The IC package 100 also includes solder mask/resist layers 145 and 155. Solder resist layers may be formed using similar materials used to form passivation layers, which are dielectric layers formed on metal layers to insulate and protect them from various build-up fabrication processes and the environment (e.g., prevent moisture absorption, oxidation, etc.). In the substrate 120, one or more passive devices and/or capacitors 150 are formed in a core layer 130. Capacitor 150 serves a couple of important functions such as acting as an energy sink for abnormal potential increases (or natural voltage source variations) and providing a path for electrical energy to be transferred between conductors. Additionally, capacitor 150 may act as a source of energy for the IC die 110.

However, one of the drawbacks of IC package 100 is the existence of the core layer 130. Depending on the substrate used the thickness of core layer 130 may range from 60 to 200 microns. This adds to the overall thickness of the IC package 100 and thereby increasing its form factor. Additionally, as previously described, cored substrates add more noise to the system by contributing additional impedance.

IC Package With Coreless Substrate

Figure 2:
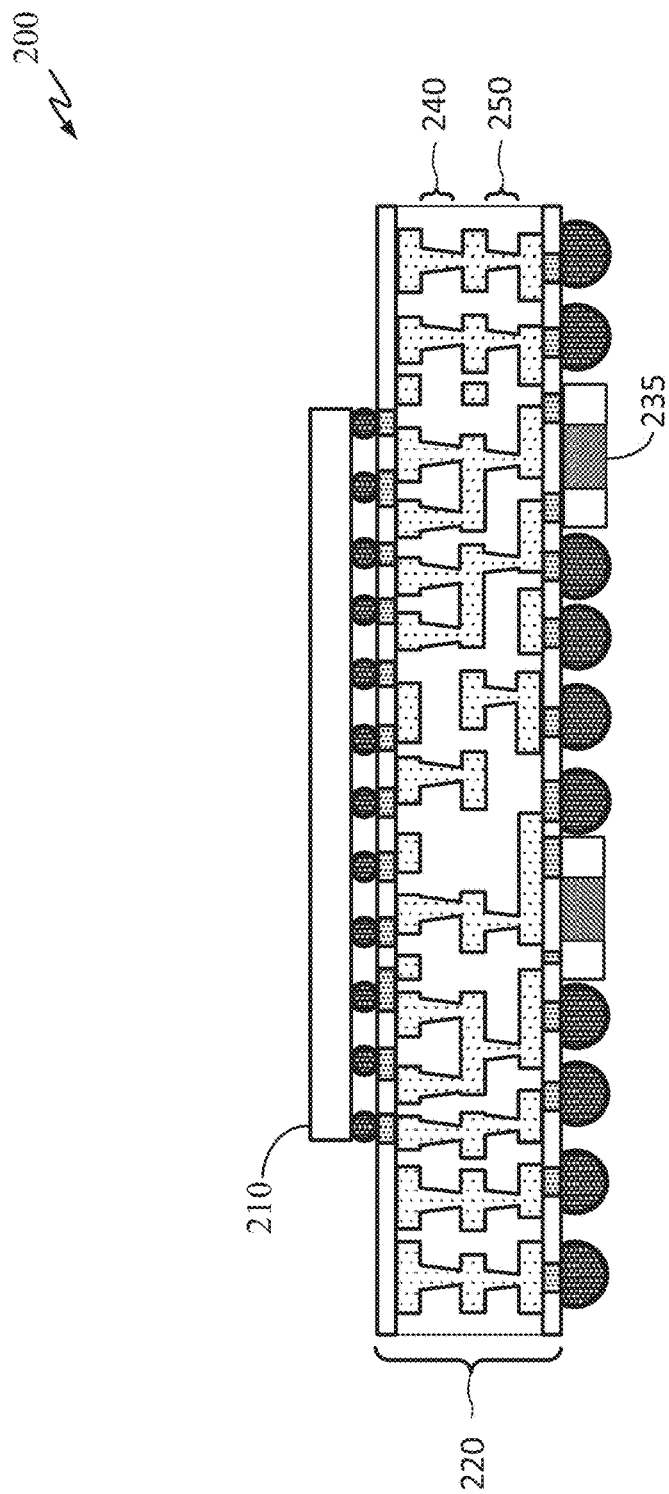
FIG. 2 illustrates an IC package with a coreless substrate and landside capacitor.

FIG. 2 illustrates an IC package 200 with a coreless substrate 220. The IC package 200 includes an IC die 210 mounted on the coreless substrate 220. As shown in FIG. 2, the substrate 220 is coreless and includes 3 metal layers and two prepreg layers 240-250. Prepreg layers 240 and 250 replace a typical core layer that normally provides the mechanical rigidity and support for a substrate. Although substrate 220 is without a core, materials for making prepreg layers 240 and 250 are carefully selected that enable the prepreg layers to act as both a dielectric and a support layer for substrate 220.

IC package 200 also includes landside capacitor 235. With the absence of a core layer, embedded passive devices such as capacitors 235 have to be relocated to the surface of substrate 220. Coreless substrates offer several advantages over cored substrates including cost reduction as the core fabrication process is eliminated, improved wiring capability, and good power characteristics. Without a core, traditionally common structures such as plated through holes (PTHs) may be eliminated. This allows for direct signaling (less use of fan out between layers) and full-layer signaling, thereby improving the signal integrity of a cureless system. Additionally, the absence of PTHs also reduces the impedance and the signaling return loss previously contributed by PTHs.

However, this configuration is not without drawbacks. Without the core, around plane and/or ground coupled terminals (vias, bumps) are placed on the surface of the substrate at the landside. This increases the distance between the ground and the signaling layer and thereby increases the inductance of the power current loop.

Improved IC Package With Coreless Substrate

FIG. 3A illustrates an IC package 300 in accordance to one aspect of the disclosure. IC package 300 includes an IC die 310 mounted on a 3 layer substrate 315. Die 310 may be attached to substrate 315 using several methods including: metal-to-metal diffusion bonding; thermal compression; partially cured isotropic conductive adhesive (ICA) bumps mated with bare substrate pads; thermoplastic ICA bumps mated with preheated bare substrate pads; fully cured ICA bumps on substrate pads with ICA paste; anisotropic conductive adhesive, etc.

Substrate 315 includes 3 metal layers 320, 322, and 324. Metal layers 320 and 324 serve both as redistribution layers and signal layers. Each of metal layers 320, 322, and 324 may have a thickness range of about 10-20 microns. In one aspect, metal layer 320 is 15 microns and metal layers 322 and 324 are 18 microns. Substrate 315 also includes prepreg layers 330 and 335 and solder mask layers 340 and 345. Each of the solder mask layers 340 and 345 may have a thickness range of about 10-35 microns. In one aspect, solder mask layers 340 and 345 have a thickness of about 20 and 15 microns, respectively.

Prepreg layers 330 and 335 may have a thickness range of about 30-60 microns. In one aspect, each of prepreg layers 330 and 335 has a thickness of about 45 microns. Prepreg layers may be made from glass impregnated cloth. In one aspect, layers 330 and 335 are formed by depositing dielectric materials to a desired thickness, using semi-additive build-up process. Substrate 315 also includes a plurality of vias 348 formed in prepreg layers 330 and 335. Vias 348 may be formed using an excimer laser via ablation.

As shown in FIG. 3A, substrate 315 also includes a conductive layer 350. In one aspect, conductive layer 350 is formed on the top most dielectric layer 340 of substrate 315. Conductive layer 350 may be made of any conductive metal that is conducive to the spraying or plating fabrication process.

Figure 3:
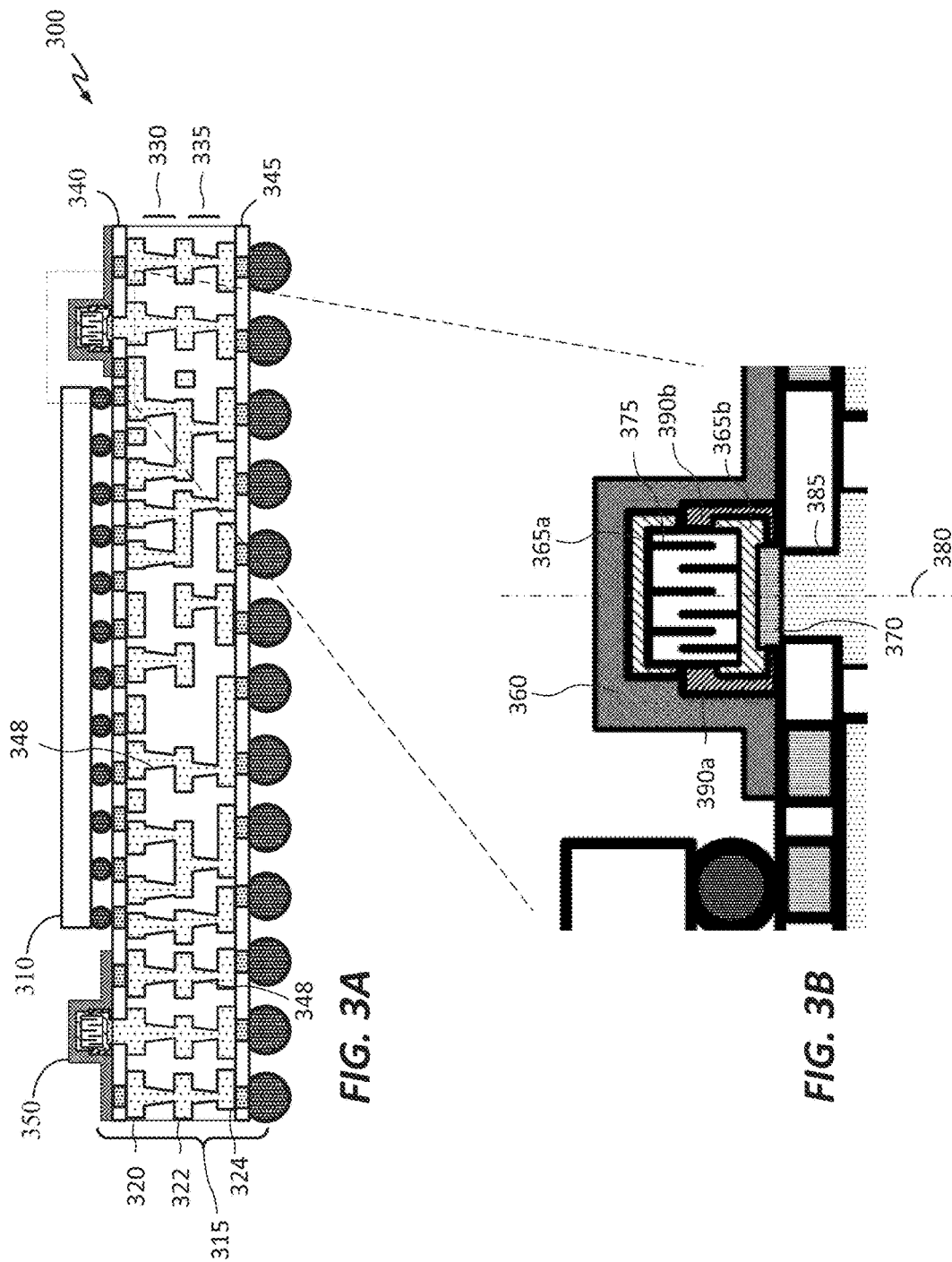
FIG. 3A illustrates an IC package with a coreless substrate and die side capacitor in accordance to one aspect of the disclosure.
FIG. 3B illustrates a die side capacitor in accordance to one aspect of disclosure.
Figure 4:
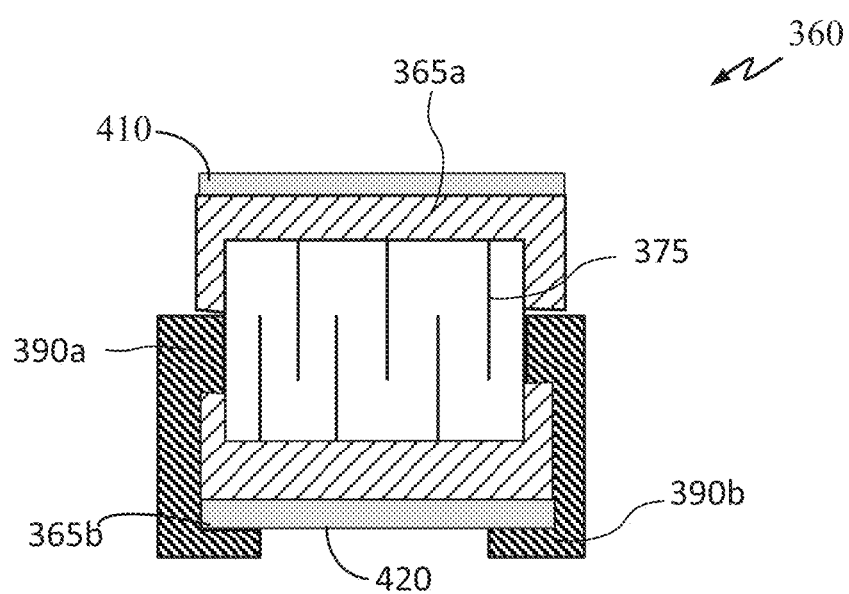
FIG. 4 illustrates a multilayer ceramic capacitor in accordance to one aspect of the disclosure.

FIGS. 3B and 4 illustrate a multilayer ceramic capacitor (MLCC) 360 in accordance to aspects of the disclosure. In one aspect, conductive layer 350 fully encapsulates capacitor 360, which is located on the die side of the substrate 315. Conductive layer 350 may also partially encapsulate capacitor 360. In one aspect, conductive layer 350 may be coupled to ground. Alternatively, conductive layer 350 may be coupled to a power source/plane.

As shown in FIG. 3B, capacitor 360 includes vertically interleaved layers 375 and two electrodes 365a and 365b with a common axis 380 that is perpendicular to the planar surface of substrate 315. Electrode 365a is coupled to conductive layer 350. Electrode 365b is electrically coupled to a metal pad 385 via a conductive adhesive layer 370. Alternatively, adhesive layer 370 is optional when coupling capacitor 360 to substrate 315 as other coupling methods could be used. Once capacitor 360 is coupled to substrate 315, conductive layer 350 could be sprayed or plated onto substrate 315 and capacitor 360.

Capacitor 360 also includes insulating layers 390a-b to isolate electrode 365b from conductive layer 350. In this way, conductive layer 350 only makes contact with electrode 365a. In one aspect, capacitor 360 has a thickness range of about 0.1-0.2 mm and a width of about 0.5 mm. In one aspect, electrode 365a may be coupled to ground ($V_{ss}$) via conductive layer 350 and electrode 365b may be coupled to a power source ($V_{dd}$). In this way, capacitor 360 can act as a decoupling capacitor to filter out voltage variants and provide a constant voltage source. Any voltage variants or ripples may be passed to conductive layer 350 (ground) while delivering direct current to the rest of the IC. It should be noted that the electrical connections for capacitor 360 may be reversed. In other words, electrode 365a may be coupled to power via conductive layer 350 and electrode 365b may be coupled to ground.

Referring now to FIG. 4, capacitor 360 may also include resistive layers 410 and 420. Resistive layers 410 and 420 are used to control the equivalent series resistance (ESR) of capacitor 360. Each of resistive layers 410 and 420 may be screen printed on each electrode of capacitor 460. Alternatively, resistive layers 410 and 420 may be made from a conductive adhesive with a certain resistive property. In one aspect, the resistance of resistive layers 410 and 420 may be selected to optimize the impedance of capacitor 360. Additionally, the equivalent series inductance (ESL) of capacitor 360 is lower than traditional die side horizontal capacitor because the current path through the capacitor is reduced. This is partially due to the thinness of capacitor 360 and because the current path through capacitor 360 is vertical along the vertically interleaved layers. In one aspect, capacitor 360 is coupled to each metal layer of substrate 315 using vias and/or fan out.

As previously mentioned, IC packages with a coreless substrate have better electrical performance than IC packages with a cored substrate. Regarding IC package 300, in addition to having better electrical performance than IC packages with a cored substrate, IC package 300 also has better electrical performance than coreless substrate IC package 200 for a variety reasons. First, landside capacitors 235 are replaced by low profile vertical capacitors 360 on the die side of substrate 315. This frees up space on the landside and allows for the better design of the power/ground distribution network (e.g., more fan out area, more lenient process control, etc.). Additionally, more via connections can be made between metal layers 320 and 324 thereby lowering the inductance from IC die 310 to capacitor 360. In one aspect, the total thickness of substrate 315 is 160-190 microns.

On a high level, when conductive layer 350 is coupled to ground, the current return path is also reduced as compared to having the ground layer/connection at the landside as shown in IC package 200. A close/short return path improves signal integrity by reducing the inductance of the signal lines and therefore signal to signal coupling. Empirical data also confirm the enhanced electrical performance of IC package 300 over IC packages 100 and 200.

Empirical data show that IC package 300 has better insertion loss performance than IC packages 100 and 200. Insertion loss is a metric that provides information about the signal quality of the transmitted signal and the bandwidth of the interconnect. Insertion loss is measured in units of dB. Typically, an insertion loss of less than −3 dB is acceptable. The insertion loss at 2.5 GHz for IC package 300 is lower than IC package 100 and almost the same as IC package 200 (graph not shown). For frequency beyond 3.5 GHz, the insertion loss for IC package 300 is lowest as compared to IC packages 100 and 200.

Empirical data also show that IC package 300 has better return loss performance than IC packages 100 and 200. Return loss is a metric that provides information about the impedance match of an interconnect of a reference system. It should be noted that for return loss, a high negative dB number is better than a lower negative number. For example, a small amount of reflected amplitude indicates a good impedance match, but it would yield a large negative number in dB. For example, −40 dB indicates a very good matched system. Whereas, a −25 dB indicates a 5% signal loss (which is still a good number). At 2.5 GHz, the measured return loss for IC package 300 is approximately −32 dB.

Figure 5:
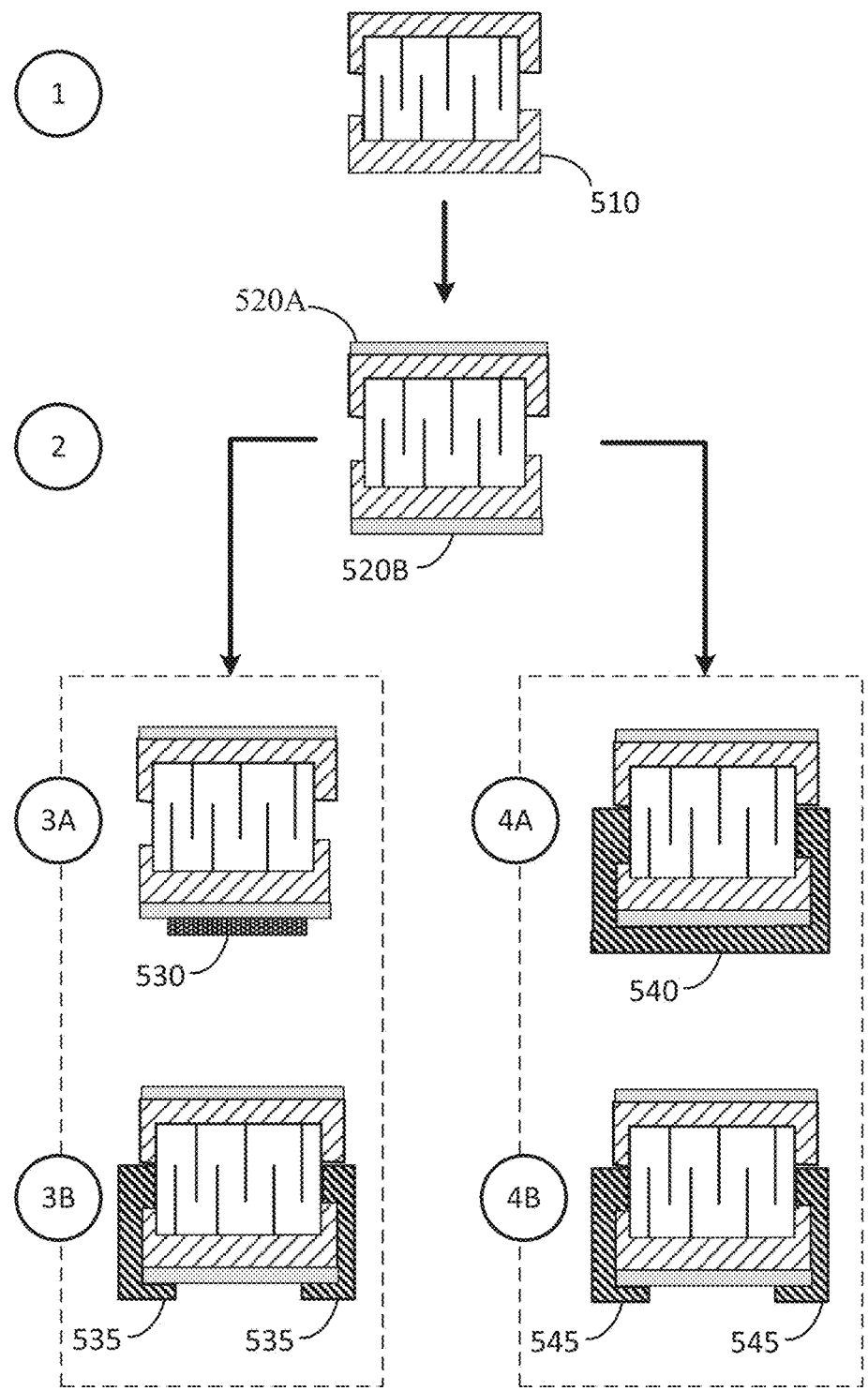
FIG. 5 illustrates processes for fabricating a multilayer ceramic substrate in accordance to one or more aspects of the disclosure.

FIG. 5 illustrates two processes for fabricating a multilayer ceramic capacitor in accordance to one or more aspects of the disclosure. At stage 1, a MLCC 510 is provided. MLCC 510 includes two electrodes, each electrode is mounted at the end of the vertically interleaved capacitor stack. Each layer of the interleaved stack may be additively formed one at a time. Alternatively, each layer is laminated on top of one another and then rolled or coiled and then cut to form the vertically interleaved stack.

At stage 2, resistive control layers 520A and 520B are formed on each of the electrodes. Depending on the design of the PDN, the resistance of the resistive control layer may be selected to achieve a desired impedance for MLCC 510. Resistive control layers 520 may be sprayed on or adhesively attached to the electrodes of capacitor 510.

Stages 3A-B and 4A-B represent different processes for forming the insulating layers 535 and 545. Referring now to stages 3A-B, at stage 3A, a mask 530 may be applied to cover a portion of electrode 520B. At stage 3B, capacitor 510 is partially dipped into an insulating liquid bath (not shown). As shown in FIG. 5, capacitor 510 should be dipped sufficiently deep into the liquid bath such that the inner interleaved layer is protected. Mask 530 protects the portion of electrode 520B from being covered by the insulating liquid. Once the insulating layer is formed, mask 530 is removed to expose electrode 520B.

Alternatively, the insulating layer 545 may be formed using the process shown in stages 4A-B. At stage 4, capacitor 510 is dipped into the insulating bath, without a mask. Once the insulating layer, the insulating portion may be cut at stage 4B to expose electrode 520B.

In one aspect, insulating layer 535 may be adhesively attached to MLCC 510 using a non-conducting adhesive.

Figure 6:
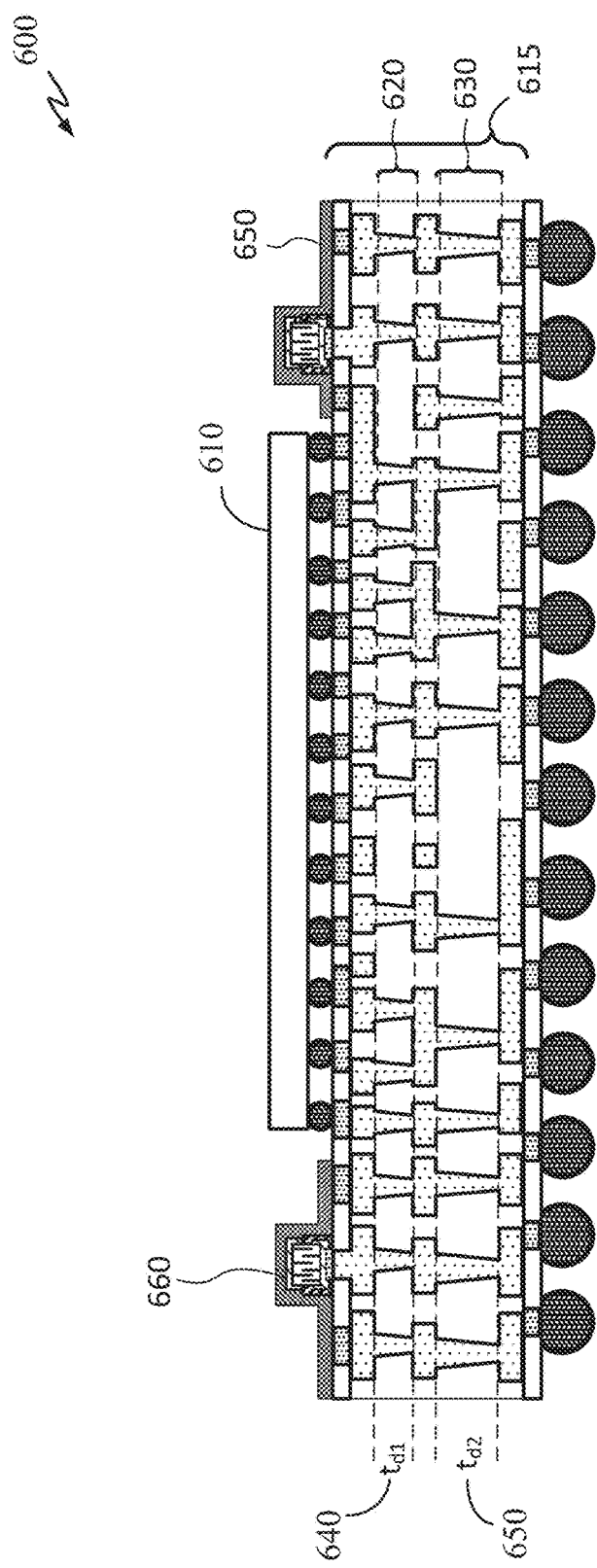
FIG. 6 illustrates a first exemplary IC package in accordance to one aspect of the disclosure.

FIG. 6 illustrates an IC package 600 in accordance to an aspect of the disclosure. IC package 600 is similar to IC package 300 as it is also a 3 layer coreless substrate 615 with a die side capacitor 660 and a conductive layer 650 formed on top of substrate 615 and the die side capacitor 660. Coreless substrate 615 includes two prepreg layers 620 and 630. In one aspect, prepreg layer 620 has a thickness 640 that is less than the thickness 670 of prepreg layer 630. By making prepreg layer 630 thicker, substrate 615 is encouraged to warp in the upward direction toward the die (smiley face) rather than in a downward direction (sad face). Generally, an IC package tends to warp downward as a whole. Thus, by encouraging substrate 615 to warp in the upward direction, the overall downward warpage of IC package 600 may be reduce. In one aspect, prepreg layer 620 has a thickness of 35 microns and prepreg layer 630 has a thickness of 55 microns.

Prepreg layer 620 may also have a different coefficient of thermal expansion (CTE) than prepreg layer 630. In one aspect, prepreg layer 620 may have a higher CTE than prepreg layer 630 to encourage warpage in the upward direction. In this way, thicknesses 640 and 670 may be made substantially the same. Alternatively, thicknesses 640 and 670 may be different while selecting materials with CTE relatively close to each other.

Figure 7:
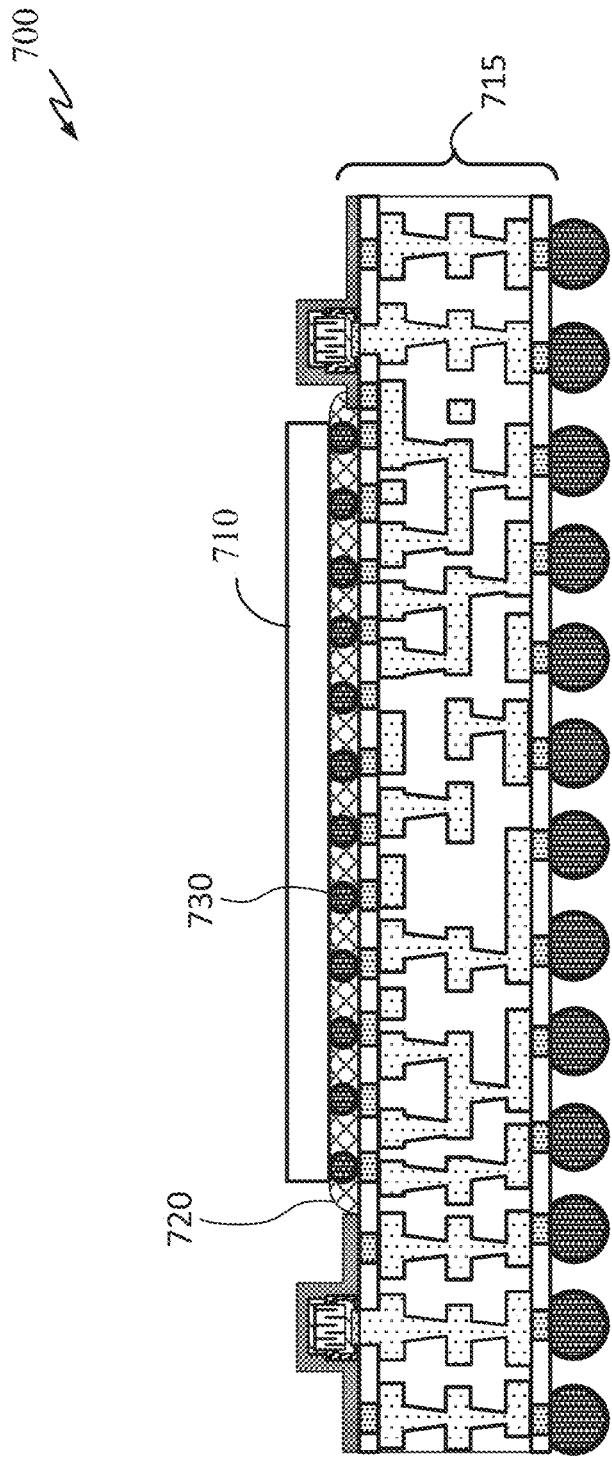
FIG. 7 illustrates a second exemplary IC packages in accordance to one aspect of the disclosure.

FIG. 7 illustrates an IC die 700 in accordance to an aspect of the disclosure. IC package 700 is similar to IC packages 300 and 600 in one or more aspects. Substrate 715 may be similar to substrate 315 and/or substrate 615. In one aspect, IC package 700 includes an underfill 720 between IC die 710 and substrate 715. Underfill 720 is disposed between die 710 and substrate 715 such that each of the bumps 730 is encapsulated by underfill 720.

Underfill 720 serves at least two important purposes. First, it provides additional materials for absorbing any compressive stress exerted on the IC package. Secondly, and most importantly, it reduces the thermal deformation caused by CTE mismatched between bumps 730 and substrate 715. With underfill 720, IC package 700 may deform uniformly as a whole rather than as separate and independent parts (i.e., die, burns, and substrates), which is undesirable.

Figure 8:
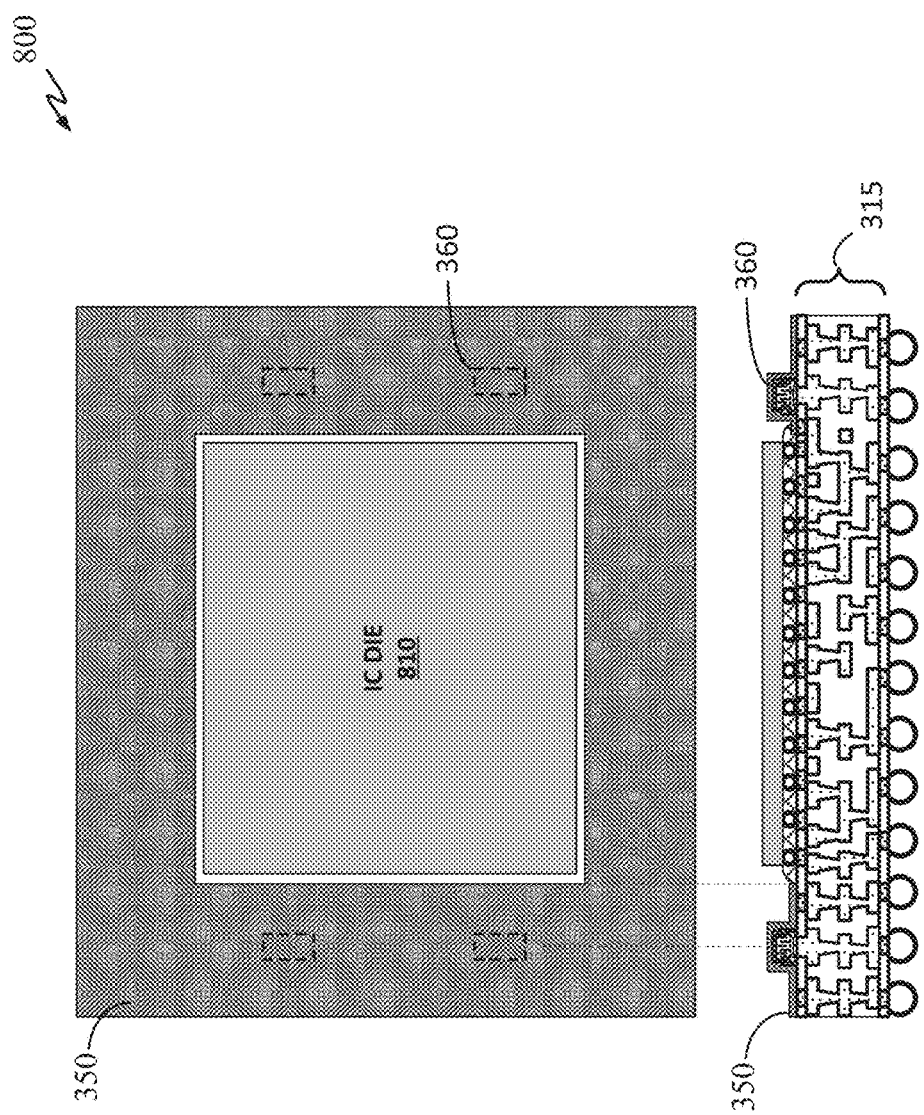
FIG. 8 illustrates a first exemplary IC package with various conductive layer configurations in accordance to one aspect of the disclosure.

FIG. 8 illustrates a top view of IC package 800 in accordance to an aspect of the disclosure. IC package 800 is similar to IC packages 300, 600, and 700 in one or more aspects. IC package 800 includes conductive layer 350 and vertical decoupling capacitor 360. As shown, conductive layer 350 is formed on substantially all of a surface area of substrate 815 and along the perimeter of die 810. Additionally, conductive layer 350 is formed on top of one of the two electrodes of capacitor 360.

Figure 9:
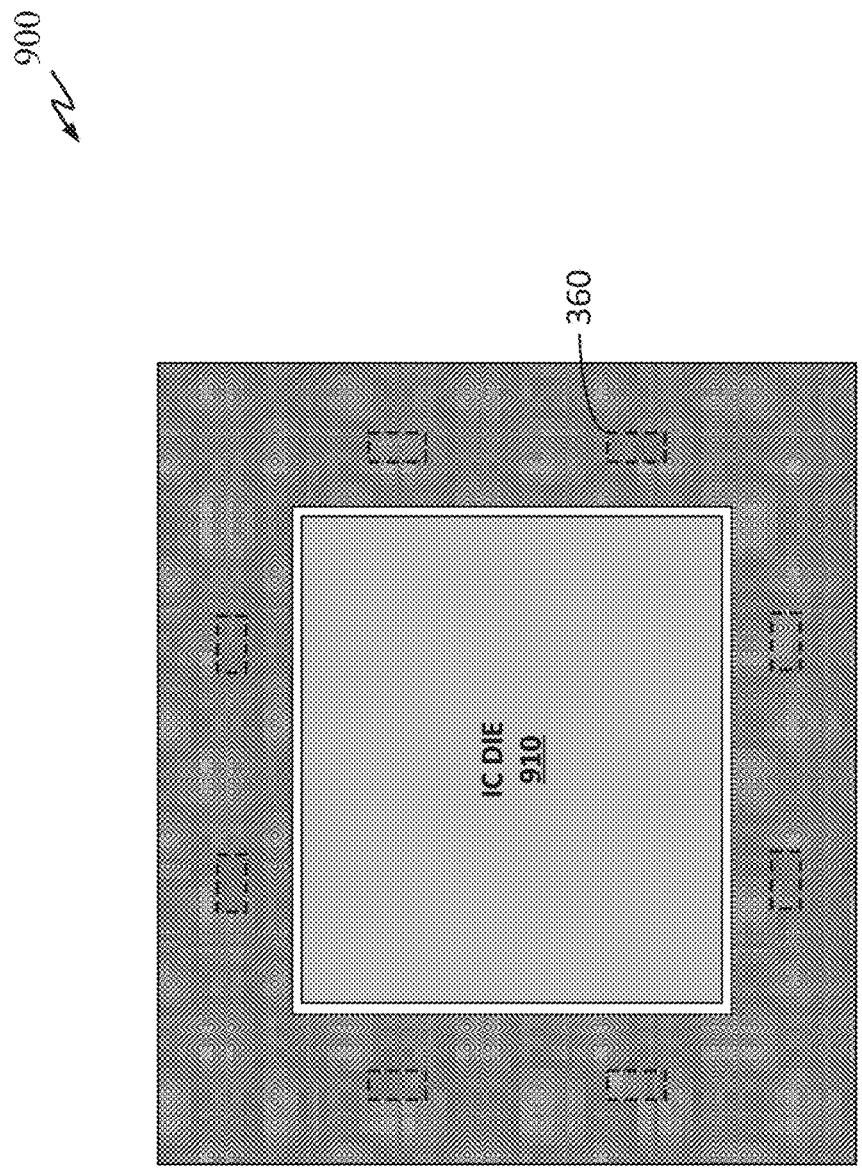
FIG. 9 illustrates a second exemplary IC package with various conductive layer configurations in accordance to one aspect of the disclosure.

FIG. 9 illustrates a top view of IC package 900 in accordance to an aspect of the disclosure. IC package 900 is similar to IC packages 300, 600, 700, and 800 in one or more aspects. IC package includes capacitors 360 coupled to the underlining substrate in various location along the perimeter of IC die 910. In one aspect, IC package 1000 includes a single row of capacitors on each side of IC die 910. Alternatively, IC package 1000 may include two or more rows of decoupling capacitors on each side of die 910.

Figure 10A:
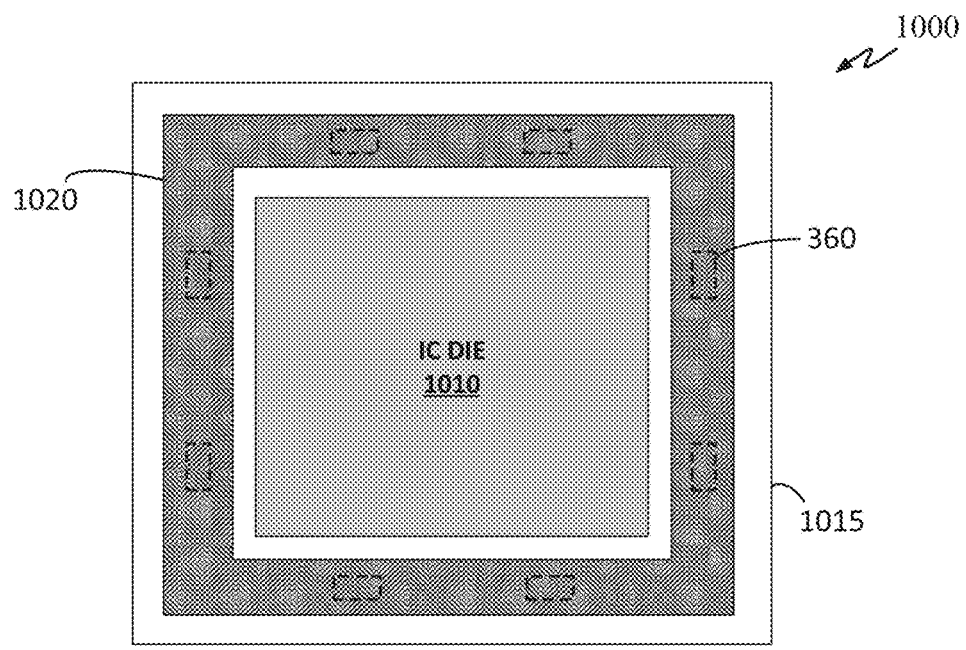
FIG. 10A illustrates a third exemplary IC package with various conductive layer configurations in accordance to one aspect of the disclosure.

FIG. 10A illustrates a top view of IC package 1000 in accordance to an aspect of the disclosure. IC package 1000 is similar to IC packages 300, 600, and 700 in one or more aspects. As shown, IC package includes a conductive layer 1020 formed on a surface of substrate 1015. In one aspect, conductive layer 1020 is formed on top of the topmost dielectric layer of substrate 1015 and on capacitors 360 such that it encapsulates capacitor 360 and also makes contact with only one electrode of capacitor 360. Conductive layer 1020 is formed on substrate 1015 such that it only partially covers the top surface of substrate 1015. In one aspect, conductive layer 1020 has a square-ring shape around the periphery of IC die 1010.

Figure 10B:
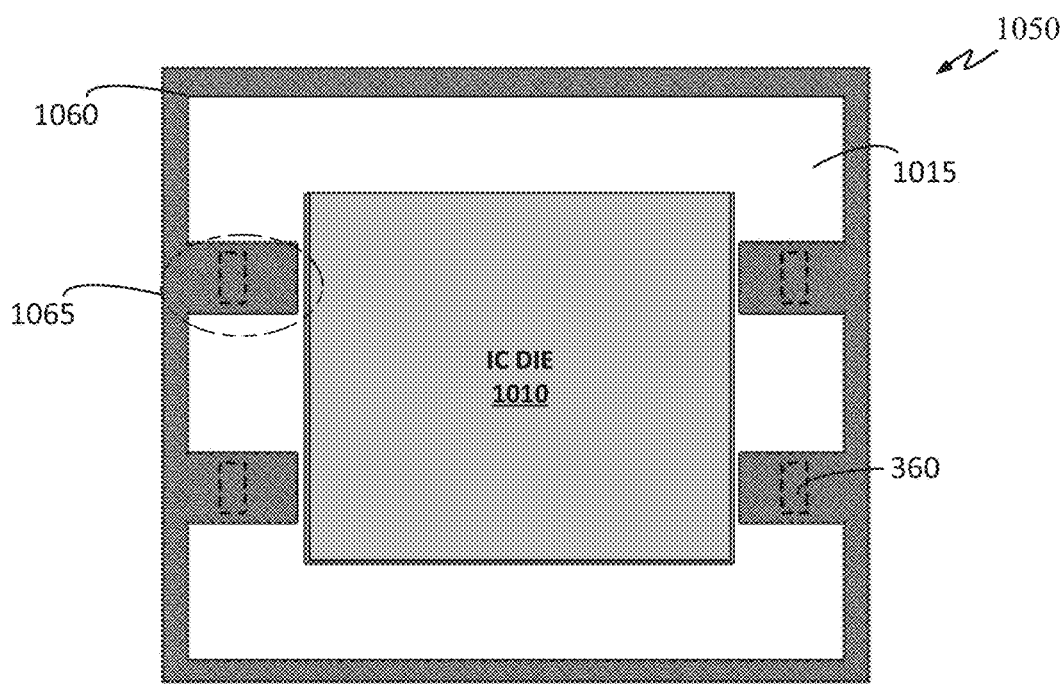
FIG. 10B illustrates a fourth exemplary IC package with various conductive layer configurations in accordance to one aspect of the disclosure.
Figure 11:
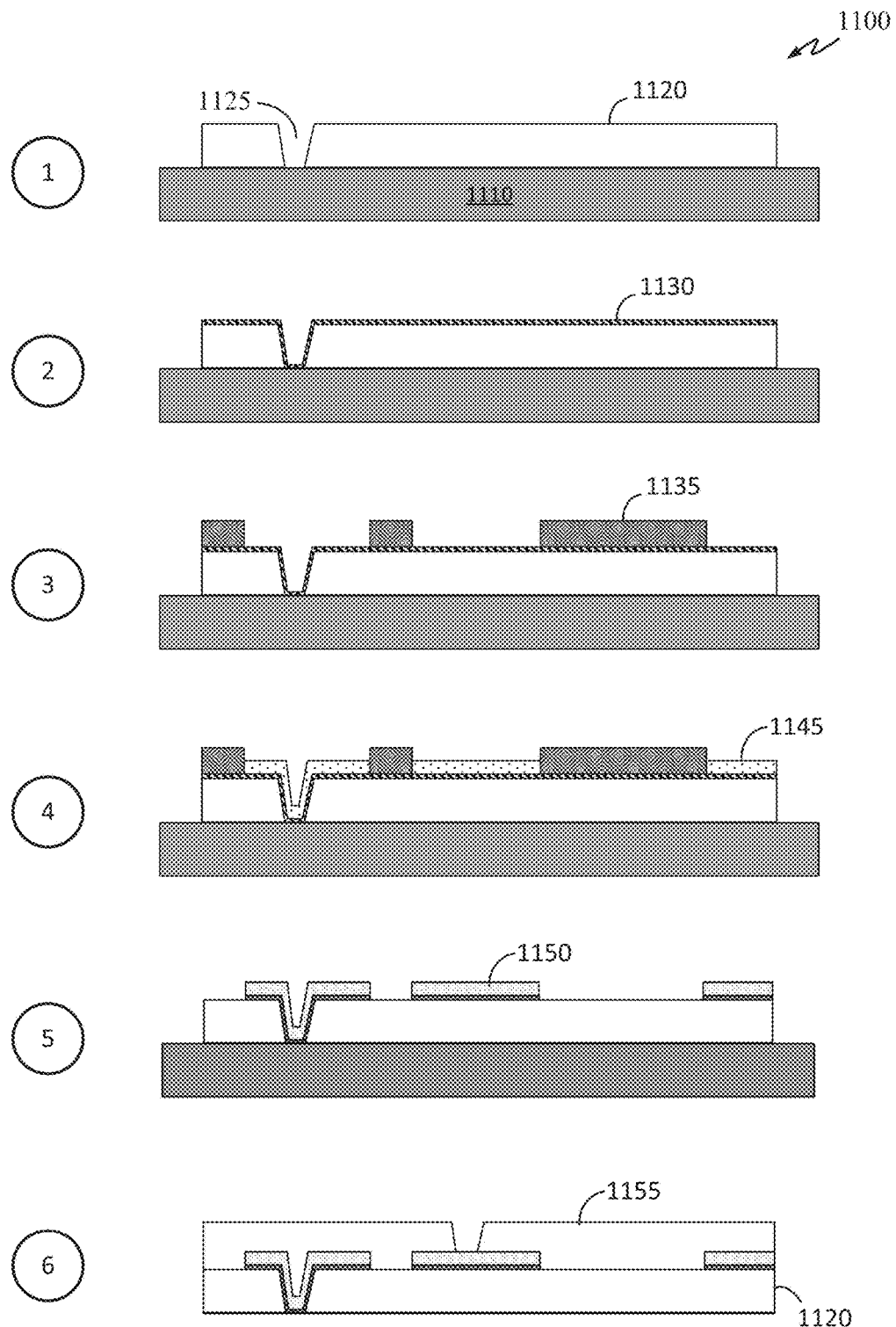
FIG. 11 illustrates a process for fabricating a coreless substrate in accordance to one aspect of the disclosure.

FIG. 10B illustrates a top view of IC package 1050 in accordance to an aspect of the disclosure. IC package 1050 is similar to IC packages 300, 600, and 700 in one or more aspects. The difference between IC package 1000 and 1050 is the shape of the conductive layer formed on the solder resist layer. In IC package 1050, a conductive layer 1060 is formed along the outer perimeter of substrate 1015. Conductive layer 1060 also has an extending portion 1065 that extends toward the die to encapsulate capacitor 360. Similar to conductive layer 350, conductive layer 1060 is formed on the solder resist layer of substrate 1015 and on only one of the electrode of capacitor 360. Conductive layer may be formed to fully or partially encapsulate capacitor 360. Although IC package 1050 is shown to have only 4 capacitors, IC package 1050 may have additional capacitors around its perimeter.

Process for Fabricating a Coreless Substrate

FIG. 1100 illustrates a process 1100 for fabricating a coreless substrate in accordance to an aspect of the disclosure. At stage 1, a prepreg layer 1120 is formed on a temporary carrier 1110. Since the substrate is coreless, a temporary platform (carrier 1110) is needed to form the coreless substrate. Once the coreless substrate is completely formed, temporary carrier 1110 can be permanently removed. After the prepreg layer is formed, vias 1125 are drilled using a laser ablation process. In one aspect, layer 1120 may be formed by depositing a layer of dielectric resin using a vacuum laminator. Once deposited, the dielectric resin layer may be partially or fully cured before the vias are laser drilled.

At stage 2, a seed layer 1130 is formed on layer 1120. Seed layer 1130 may be formed by sputtering or by evaporation. A typical seed layer material may include an adhesion of titanium (Ti) or titanium-tungsten (TiW) and another layer of copper (Cu). At stage 3, a layer of photoresist 1135 is patterned onto seed layer 1120. Next, photoresist layer 1135 is exposed and developed to form a negative circuit pattern. In general, there are two types of photoresist: a negative and a positive acting resists. Negative photoresist goes through a photo-hardening process when exposed to ultraviolet (UV) light. Conversely, positive photoresist goes through a photo-softening process during UV exposure and leaves the same pattern on the resist film after UV exposure.

At stage 4, a metal layer 1145 is electroplated on top of seed layer 1120 to form the pattern for conductive traces. Conductive layer 1145 is normally Cu. At stage 5, photoresist layer 1135 and portions of seed layer 1130 directly below layer 1135 are removed using a photoresist stripping process. At stage 6, the layer build-up process repeats with the formation of another prepreg layer or dielectric layer 1155.

Although not shown, once all of the build-up layers are formed, the last layer to be formed (top most layer) is a solder resist layer such as resist layer 340 shown in FIG. 3. Conductive pads for flip-chip bumping are then exposed by photo-etching the solder resist layer.

Processes for Coupling MLCC to Substrate and for Fabricating Conductive Layer

Figure 12A:
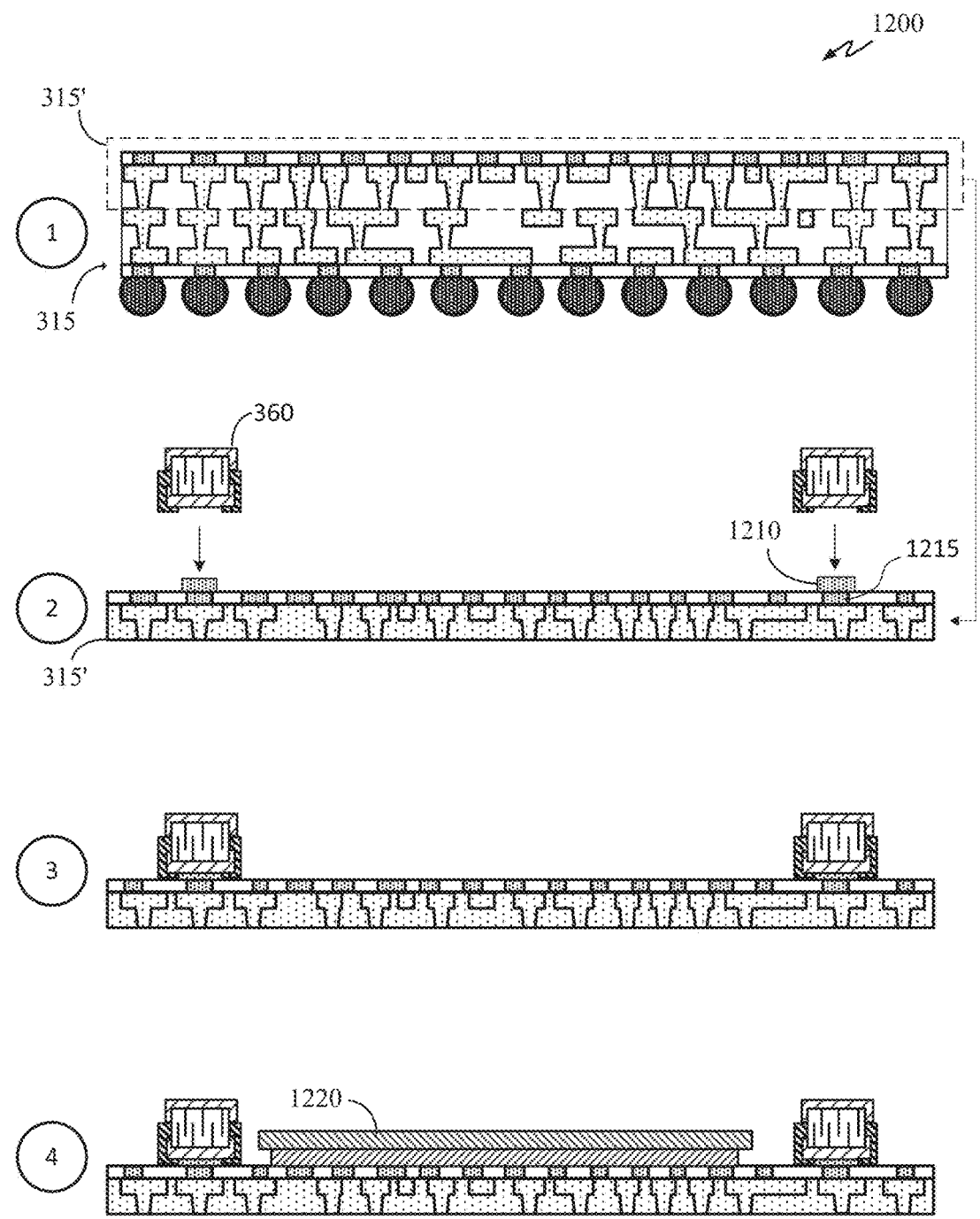
FIG. 12 (comprising FIGS. 12A and 12B) illustrates a process for attaching a capacitor to a substrate and for forming a conductive layer in accordance to one aspect of the disclosure.
Figure 12B:
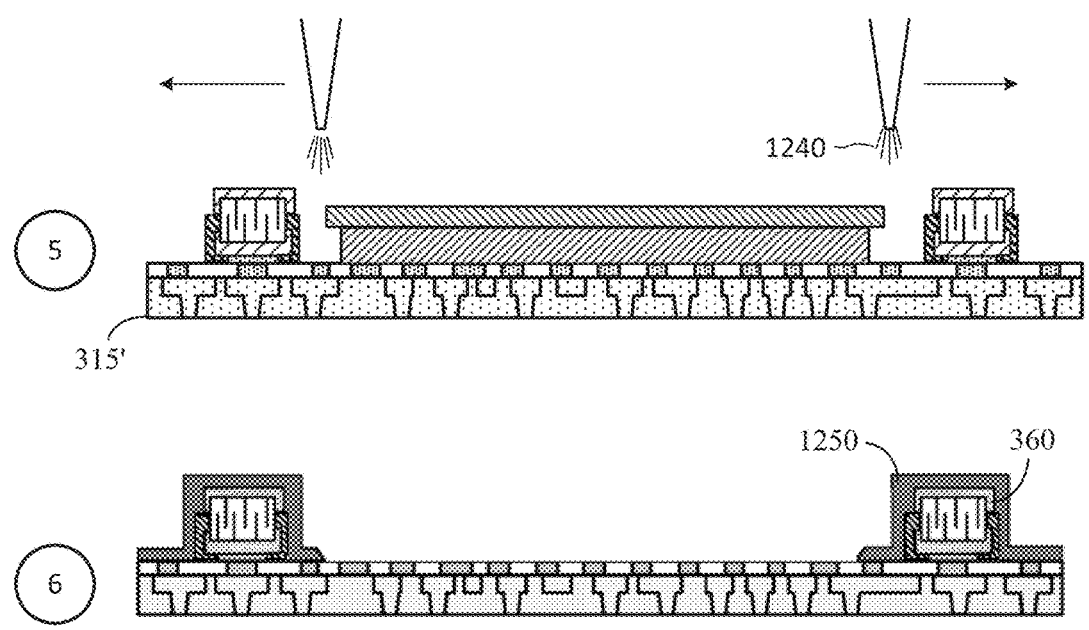

FIG. 12, which comprises FIGS. 12A and 12B, illustrates a process 1200 for coupling a multilayer ceramic capacitor to a substrate and for forming a conductive layer thereon in accordance to an aspect of the disclosure. At stage 1, a substrate such as substrate 315 is provided. At stage 2, a conductive adhesive portion 1210 is formed on a substrate pad 1215. Adhesive portion 1210 may be placed on substrate pad 1215 using a screening method. In one aspect, adhesive portion 1210 is applied in a batch process where a wafer of substrates is screened. At stage 3, adhesive portion 1215 is cured once capacitor 360 is placed into position. As shown in FIG. 12A, capacitor 360 is placed on substrate 315 such that the two electrodes are vertical to the planar surface of substrate 315. In other words, a common vertical axis of both electrodes are perpendicular to the surface of substrate 315. In stage 3, the bottom electrode of capacitor is mated with adhesive portion 1210.

At stage 4, a mask 1220 is applied onto the top surface of solder resist layer to negatively pattern the location of a conductive layer. The In one aspect, mask 1220 is a shadow mask designed to create a feather end at the end of the coating layer. Alternatively, mask 1220 is a contact mask, which helps create a vertical wall at the end of the coating layer.

At stage 5, a conductive material 1240 is selectively sprayed onto the substrate where no mask is applied to form a layer of conductive material 1250 over the top surface of the substrate and over the die side capacitor. At step 6, once conductive layer 1250 is formed, mask 1220 is removed.

Figure 13:
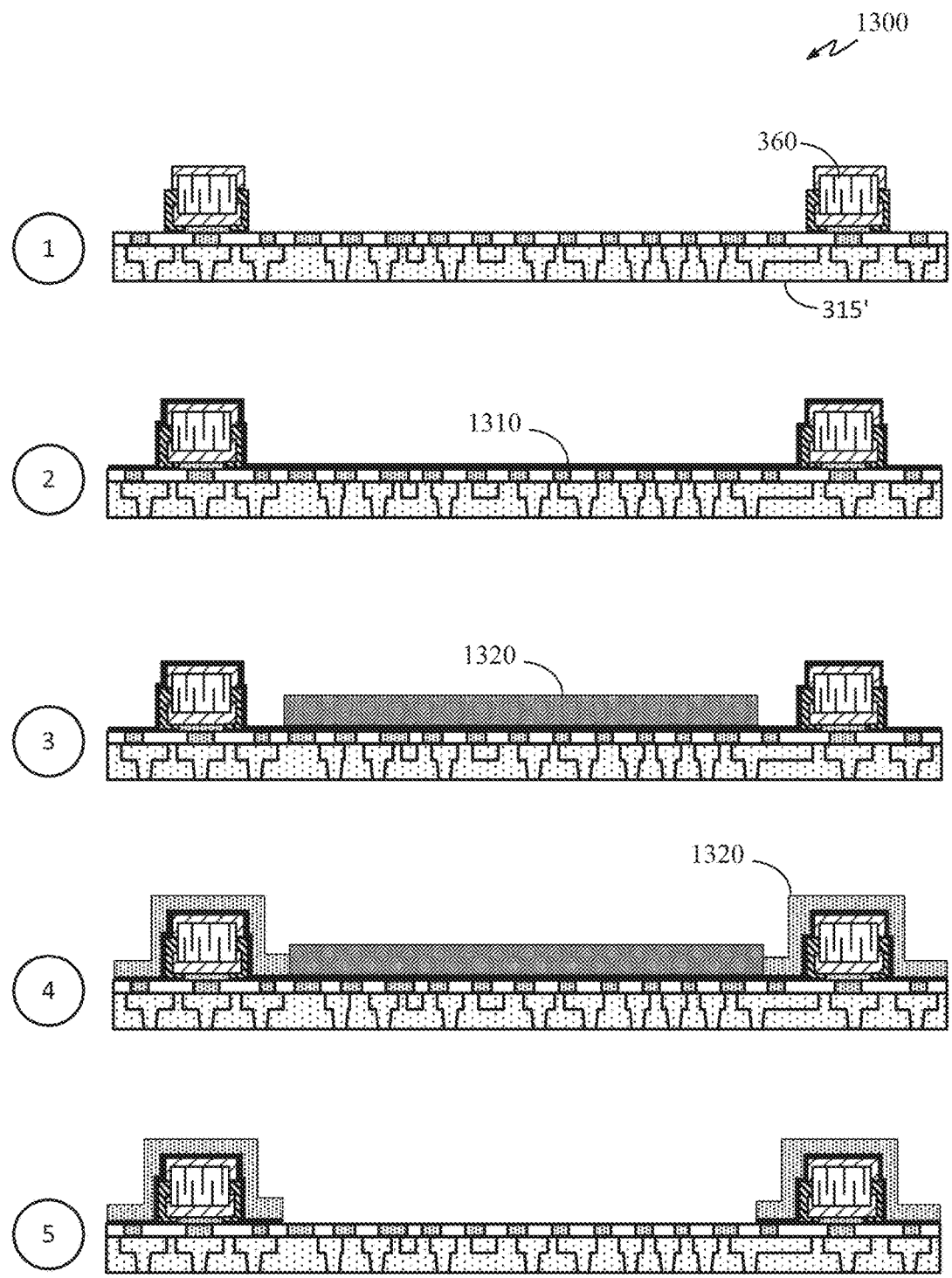
FIG. 13 illustrates a process for forming a conductive layer by plating in accordance to one aspect of the disclosure.

FIG. 13 illustrates a process 1300 for forming a conductive layer onto a substrate in accordance to an aspect of the disclosure. In one aspect, conductive layer 350 is formed on substrate 315 by a plating process rather by a spraying process as shown in FIG. 12. At stage 1, substrate 315 with a plurality of vertical capacitors 360 is provided. At stage 2, a seed/adhesion layer 1310 is applied by sputtering or by evaporation on the top surface of substrate 315. Seed layer 1310 may consist of a thin adhesion layer of Ti or TiW and a Cu layer to serve as a conductor for electroplating. At stage 3, a photoresist layer 1320 is spin-coated over seed layer 1310. The typical thickness range of the photoresist layer 1320 is 40-100 microns.

A stage 4, portions of seed layer 1310 that are not covered by the cured resist layer 1320 is electroplated to build up a layer of Cu to a desired thickness. At stage 5, the cured photoresist layer and the seed layer directly below are removed via an etching process.

Process for Fabricating IC Package with a Coreless Substrate, Die Side Vertical Capacitors, and a Conductive Layer.

Figure 14:
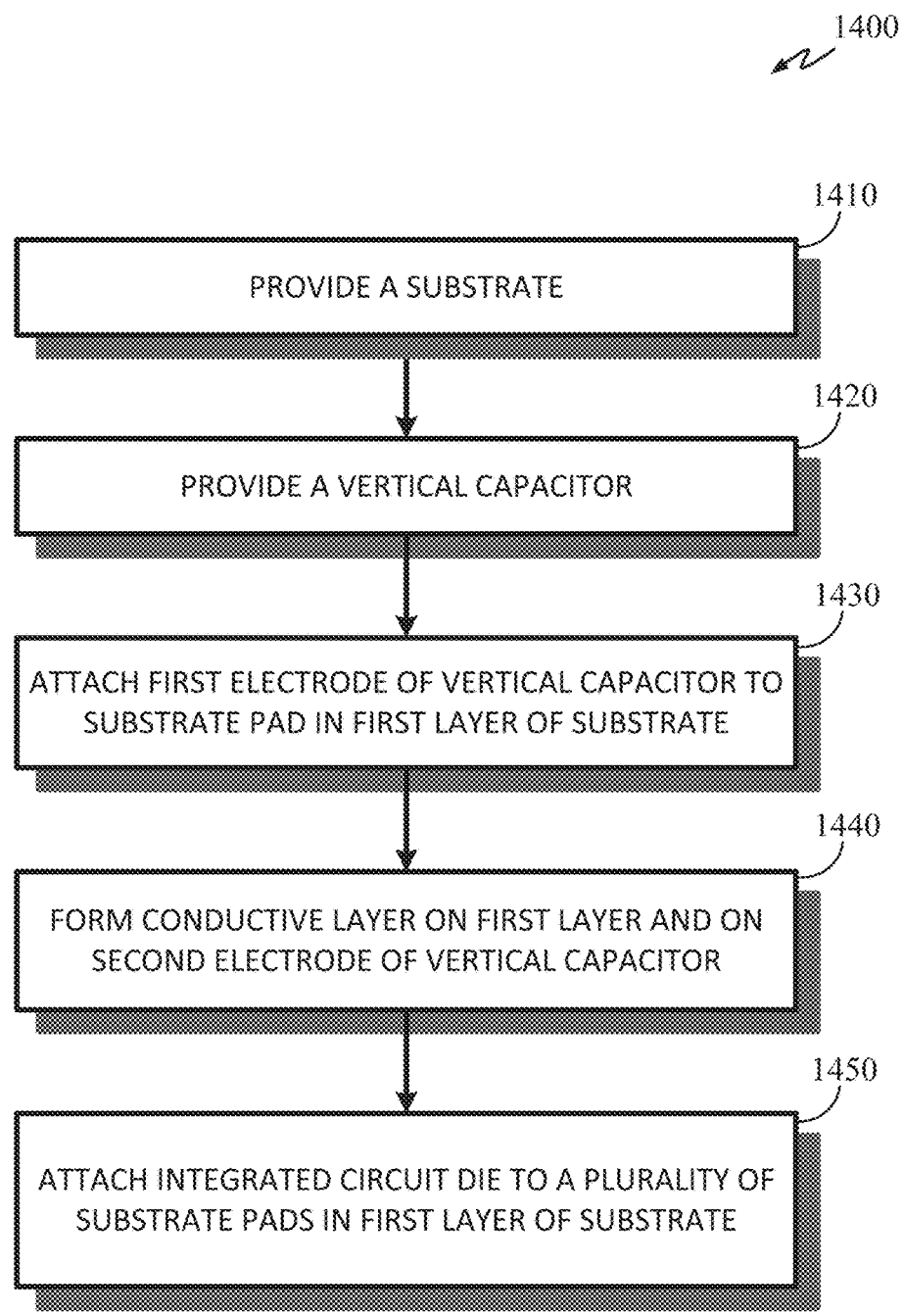
FIG. 14 illustrates a process for fabricating an IC package in accordance to one aspect of the disclosure.

FIG. 14 illustrates a process 1400 for fabricating an IC package in accordance to an aspect of the disclosure. Process 1400 may be used to fabricate any of IC packages 300, 600, 700, and 1000. Process 1400 starts when a substrate is provided 1410. In one aspect, the provided substrate may be coreless substrate 315, 615, or 715. Next, a decoupling capacitor is provided 1420. The decoupling capacitor may be a multilayer ceramic capacitor having vertical metal layers. In one aspect, the provided decoupling capacitor is similar or identical to capacitor 360.

In one aspect, the first electrode of the vertical capacitor is attached to a substrate pad exposed by an opening in the solder resist layer 1430. The first electrode is attached to the substrate in a way such that a common vertical axis of the first and second electrodes is perpendicular to the planar surface of the solder resist layer. In one aspect, the first electrode is coupled to a power source.

Next, a conductive layer is formed on the planar surface of the solder resist layer of the substrate 1440. The conductive layer is also formed on the second electrode of the capacitor such that the entire capacitor is encapsulate by the conductive layer. In one aspect, the conductive layer is coupled to ground.

Once the conductive layer is formed on the surface of the solder mask (solder resist layer) and formed to encapsulate the capacitor, the IC die is attached to a plurality of substrate pads exposed by openings in the solder masks 1450. In one aspect, the plurality of substrate pads are further built-up using an additive metallization process in order to thicken the substrate pads.

Although process 1400 is described in a flip chip environment, it should be noted that certain aspects of the disclosure described in processes 1200, 1300, and 1400 and IC packages 300, 600, and 700 are also applicable to other type of chip-to-substrate attachment technologies and IC packages. For example, certain innovative aspects relating to the vertical capacitor and conductive layer can be modified to be applicable to wire bond, BGA, μBGA IC packages, etc.

Process for Wafer Bumping on IC Die to Enable Flip Chip Attachment to Substrate

IC Dies are batch produced on a large wafer and are initially without any bumps (solder balls). Before each individual die is sliced and separated from the wafer, bumps are fabricated onto the exposed I/O pads of each die through openings in the outer most passivation layer. Bumps can be produced using several methods, including: direct deposition of molten solder using controlled collapse chip connection (C4), Cu pillar bumping, electroplating, screen printing, and conductive adhesives.

Figure 15:
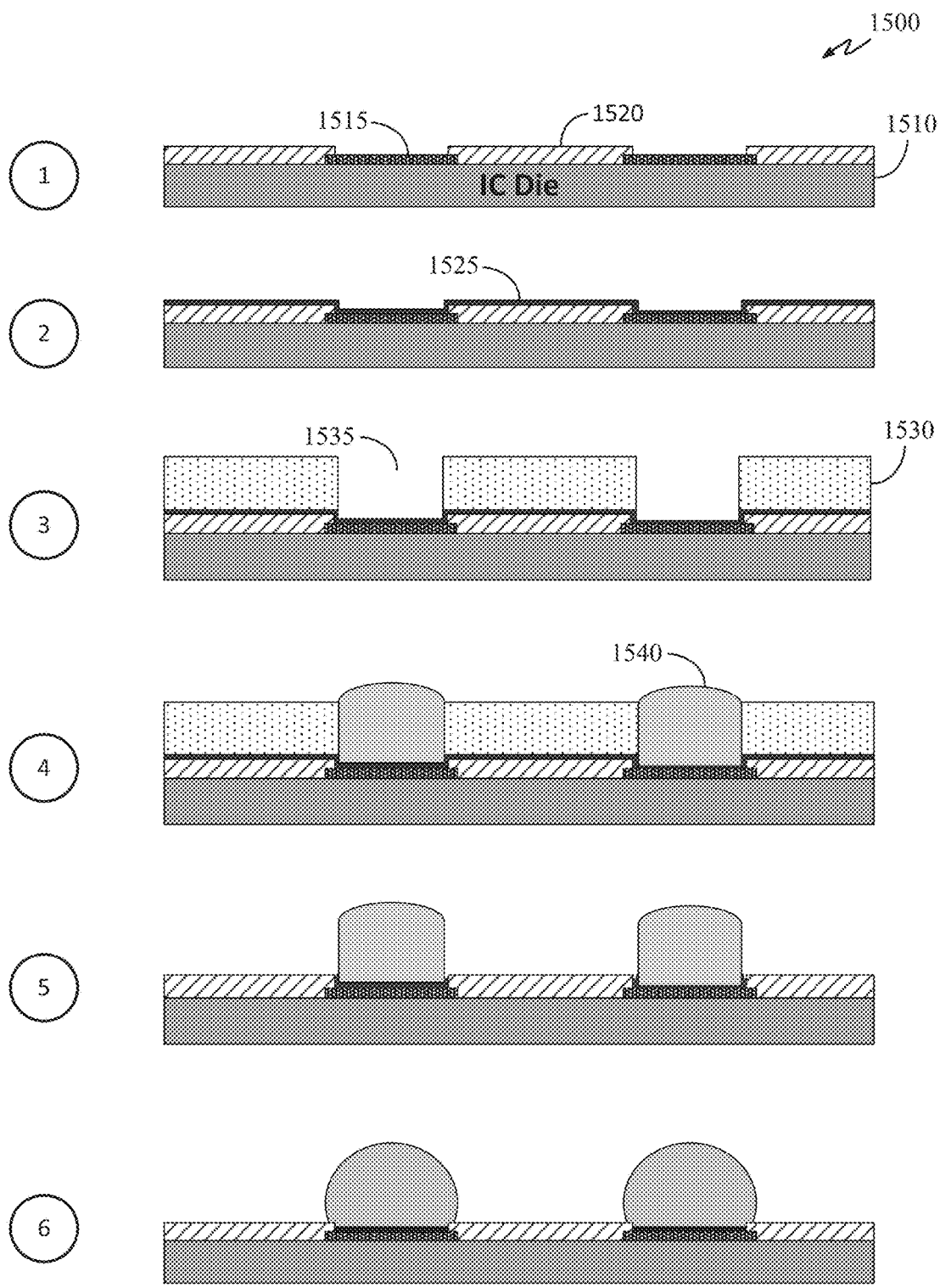
FIG. 15 illustrates a process for wafer bumping by electroplating in accordance to one aspect of the disclosure.

FIG. 15 illustrates an electroplating process 1500 for wafer bumping. Although a single die is shown, the process may be batch applied to the entire wafer. At stage 1, a wafer with a plurality of IC dies is provided. Each IC die 1510 includes a plurality of I/O pads 1515 and a passivation layer 1520. At stage 2, an under-bump metallization (UMB) layer 1525 is formed using a sputtering process. UMB layer 1525 serves several important purposes. It provides a diffusion barrier to keep the mating material from harming the underlying die I/O pad. It also provides an adhesion layer to the underlying dielectric metal layer. Additionally, UMB layer 1525 can provide some protection against the migration of contaminants along the dielectric layer to the metal layers below and above.

At stage 3, a layer of photoresist 1530 is spin coated onto the entire wafer. Photoresist layer 1530 is then exposed through a photomask to form a pattern on the photoresist layer. Next, the photoresist layer is developed to leave behind the desired pattern. In this case, openings 1535 are formed once the photoresist layer is developed. At stage 4, layers of lead-tin (PbSn) and Cu are deposited by electroplating to form hump structures 1540. At stage 5, photoresist layer 1530 and the un-plated UMB layer portions located under the developed portions of photoresist layer 1530 are removed by an etching process. At stage 6, the bump structures are formed into spherical shape using a solder reflow process. In the reflow process, the wafer is placed in an oven to bring bump structure 140 above the solder melting point. Upon cooling, the bumps take a spherical shape and are bonded to the UMB layer.

Process for Wafer Bumping on IC Die Using Stencil Printing

Figure 16:
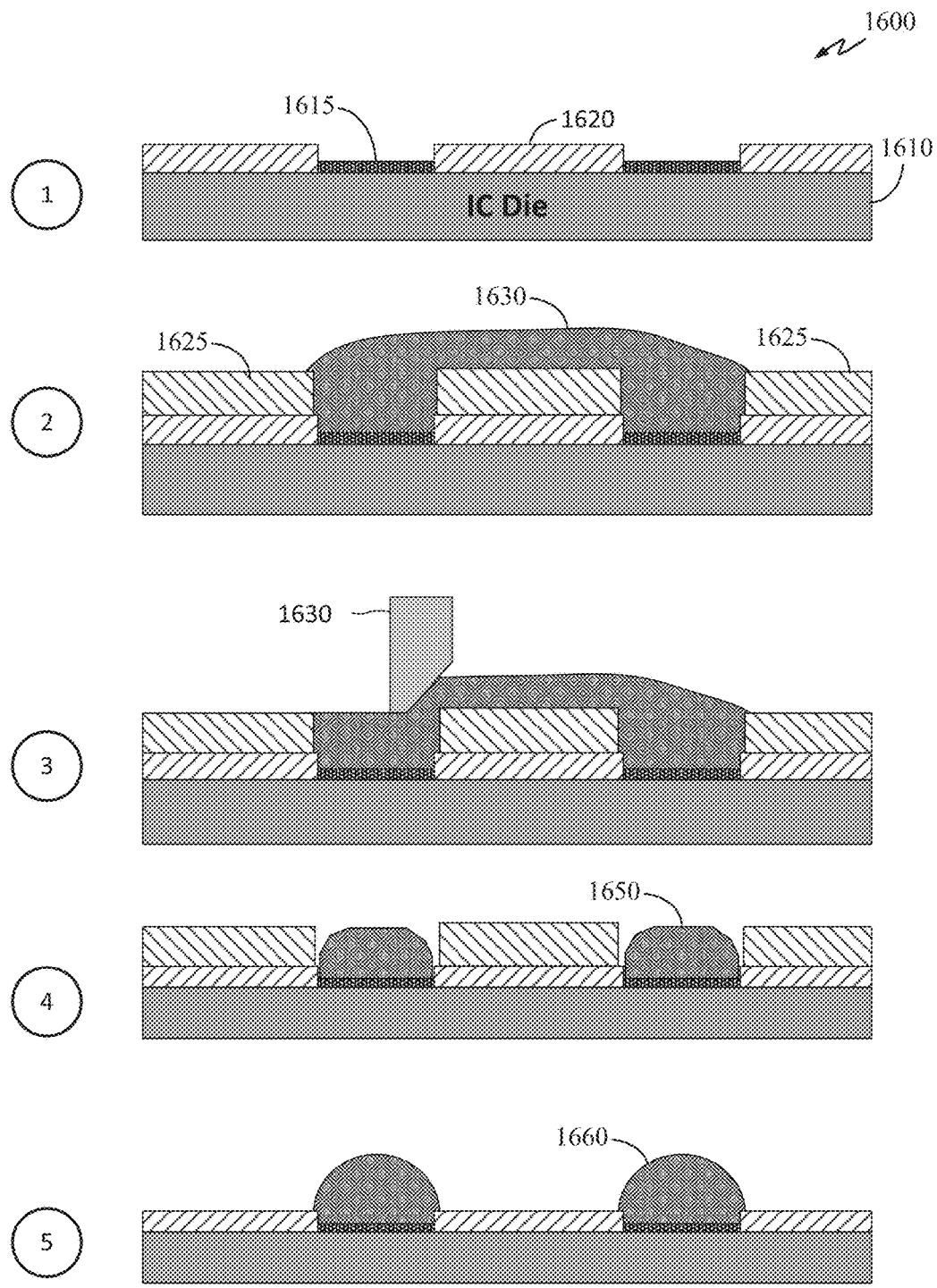
FIG. 16 illustrates a process for wafer bumping by stencil printing in accordance to one aspect of the disclosure.

FIG. 16 illustrates a stencil printing process for wafer humping. At stage 1, a wafer with a plurality of IC dies is provided. Each IC die 1610 includes a plurality of I/O pads 1615 and a passivation layer 1620. At stage 2, a solder paste mask 1625 is applied to the wafer. Mask 1625 has openings that matches with the locations of I/O pads on each die of the wafer. Once mask 1625 is correctly positioned, a solder paste 1630 is applied to the entire wafer. In one aspect, mask 1625 can be replaced by a photoresist patterning step.

Solder paste 1630 contains a mixture of flux, thixotropic agents, and very fine solder balls. At stage 3, a squeegee tip 1635 is applied across the surface of the mask to force in the solder paste through the openings of the solder mask. At stage 4, the solder paste is allowed to partially set. Next, the solder reflow process takes place to melt solder structures 1650 and form spherical bumps 1660. At stage 5, mask 1625 is removed after solder bumps 1660 solidified.

Process for Substrate Bumping Using Electroless Deposition

As previously mentioned, IC die 310 may be attached to substrate 315 using several methods including: metal-to-metal diffusion bonding; thermal compression; partially cured isotropic conductive adhesive (ICA) bumps mated with bare substrate pads; thermoplastic ICA bumps mated with preheated bare substrate pads; fully cured ICA bumps on substrate pads with ICA paste; anisotropic conductive adhesive, etc.

Figure 17:
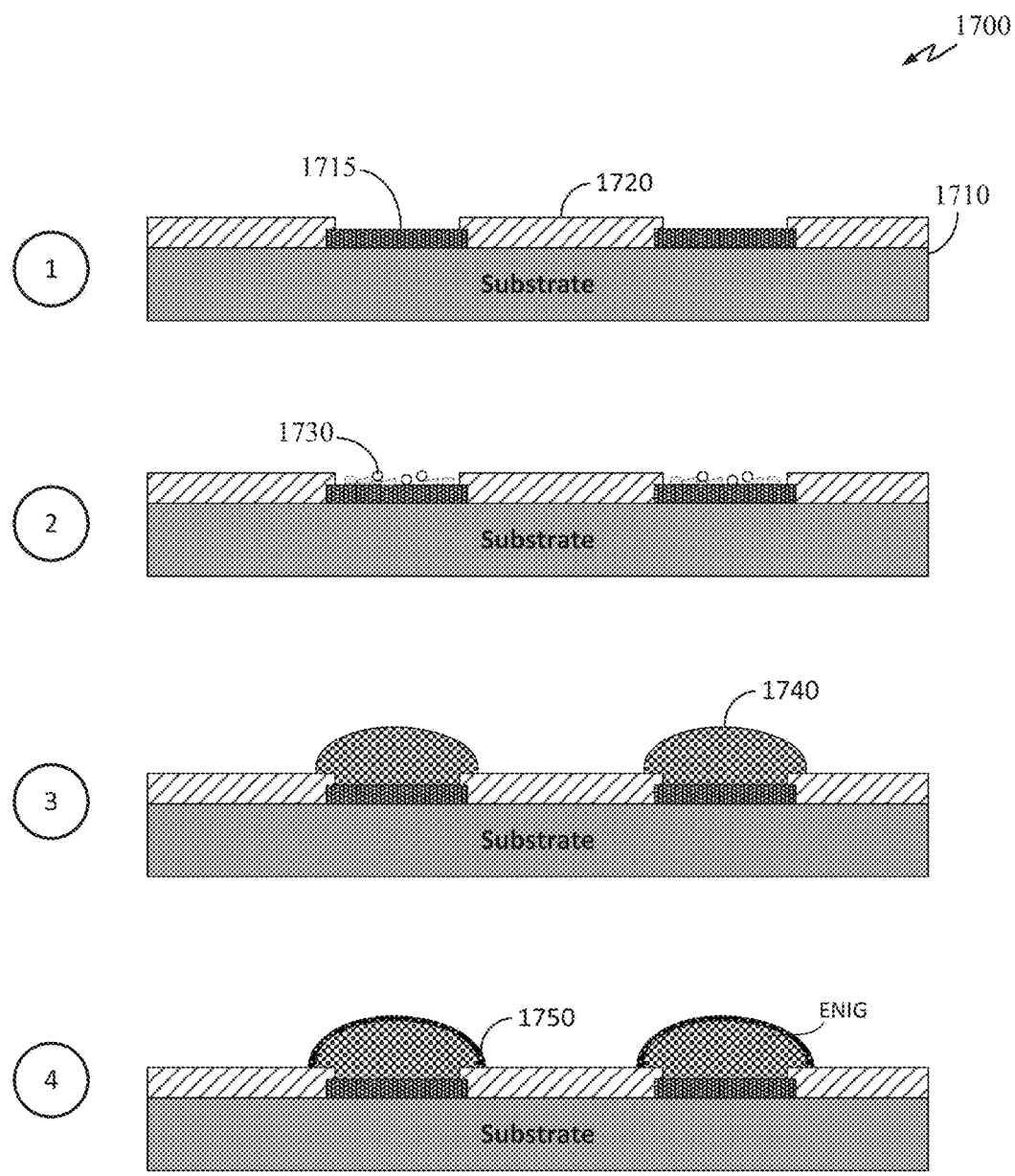
FIG. 17 illustrates a process for substrate bumping by electroless plating in accordance to one aspect of the disclosure.

In the metal-to-metal diffusion bonding process, the bonding strength and mechanical reliability is enhanced when the substrate is prepped with small bumps on the substrate pads. This facilitates the FC attachment process to the substrate. FIG. 17 illustrates an electroless NI substrate bumping process 1700. At stage 1, substrate 1710 is at its bare state without bumps. Substrate 1710 includes I/O pads 1715 and solder resist layer 1720. In stage 1, substrate 1710 is cleaned by submerging the entire wafer to two cleaning baths. The first bath removes possible residues from the passivation layer and substrate I/O pads. The second bath roughens the substrate I/O pads, which is typically made of Aluminum. The second bath also removes Al oxides from the Al substrate pads.

At stage 2, the entire wafer is immersed in a zinc bath to form a Zn layer 1730 on the Al I/O pads. This activates the surface of the substrate pads for the subsequent Ni electroless plating process. At stage 3, once the Zn layer is deposited, Ni ions in the zincate bath continues to react with Zn layer 1730. A Ni structure 1740 is formed as a continuous reaction occurs between the Zn and the Ni ions. At stage 4, a thin gold layer is coated on top of Ni structure 1740 through a thin immersion process to form a Ni(P)/Au bumps, which is also referred to as ENIG (electroless Ni(P) with Au immersion).

Process for Flip Chip Attachment to Substrate

Figure 18:
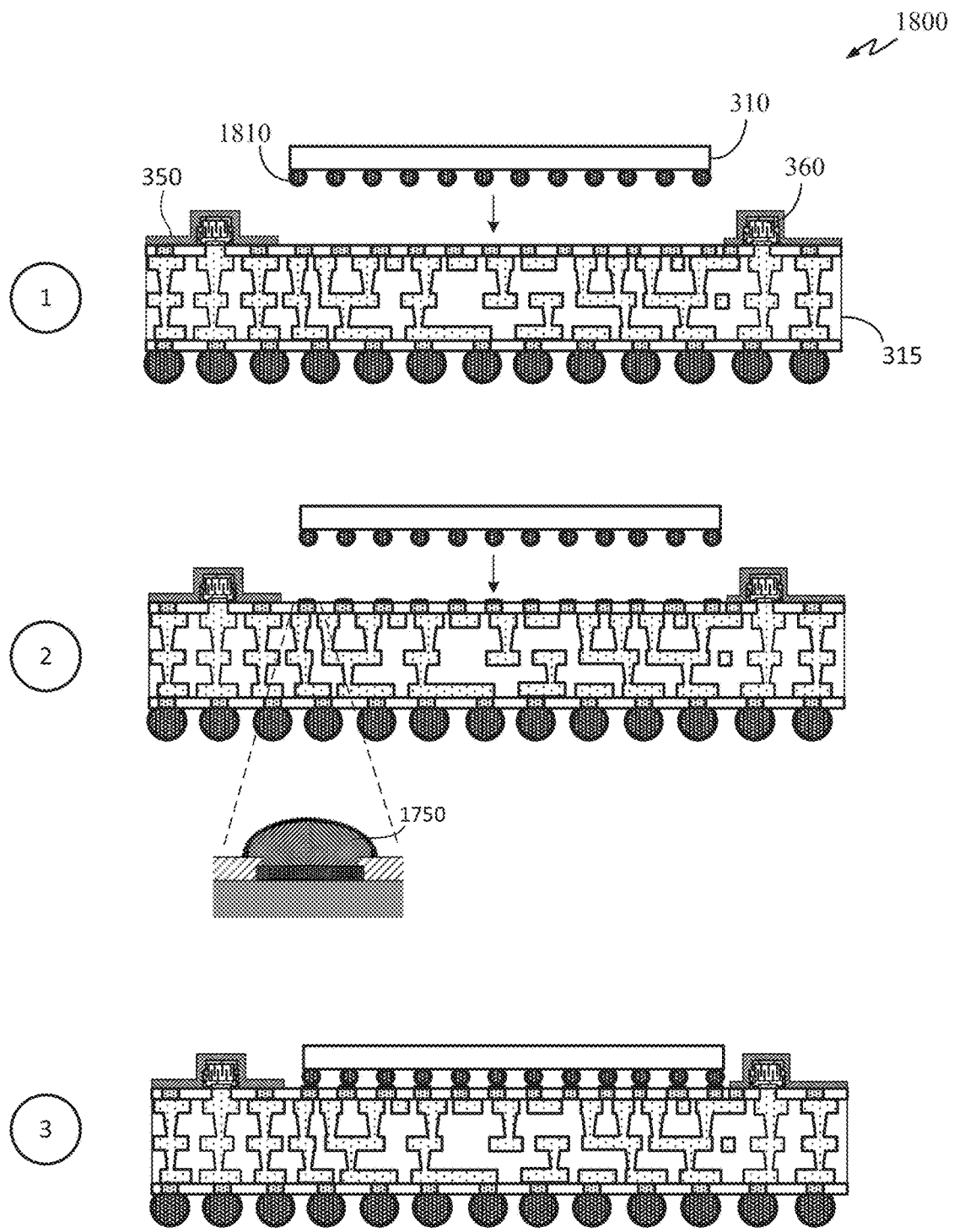
FIG. 18 illustrates a process for flip chip attachment to substrate in accordance to one aspect of the disclosure.

A widely used method to attach a flip chip onto a laminate substrate is to mate solder bumps on IC die with ENIG bumps on the laminate substrate. ENIG bumps may be fabricated using ENIG bumps forming process 1700. FIG. 18 illustrates a process 1800 for FC attachment to a coreless substrate with ENIG bumps 1750. At stage 1, IC die 310 and substrate 315 are provided. IC die 310 includes bumps 1810. Substrate 315 includes ENIG bumps 1750, which is shown at stage 2. In stage 2, both die 310 and substrate 315 are heated to a temperature where solder bumps 1810 are partially melted and solder flow is at least partially occurring. At stage 3, each bump 1810 of IC die 310 is mated to a corresponding ENIG bump 1750 on substrate 315. In one aspect, substrate 315 and die 310 are heated to approximately 200 to 240 degrees Celsius, the approximate reflow temperature for most solders. In stage 3, the Ni(P) layer reacts with the solder and create a fused mating joint (not shown).

Process for Underfilling

Under filling is important as it provides additional materials for absorbing any compressive stress exerted on the IC package. Underfill also helps reduce the thermal deformation caused by CTE mismatched between IC bumps and various substrate 715 components such as solder resist layer, passivation layer, substrate pads, etc. With an underfill, an IC package may be able to deform uniformly as a whole rather than deforming at different rate at each layer. Underfill materials are typically made of filled epoxy polymers with high Tg and low CTE.

Figure 19:
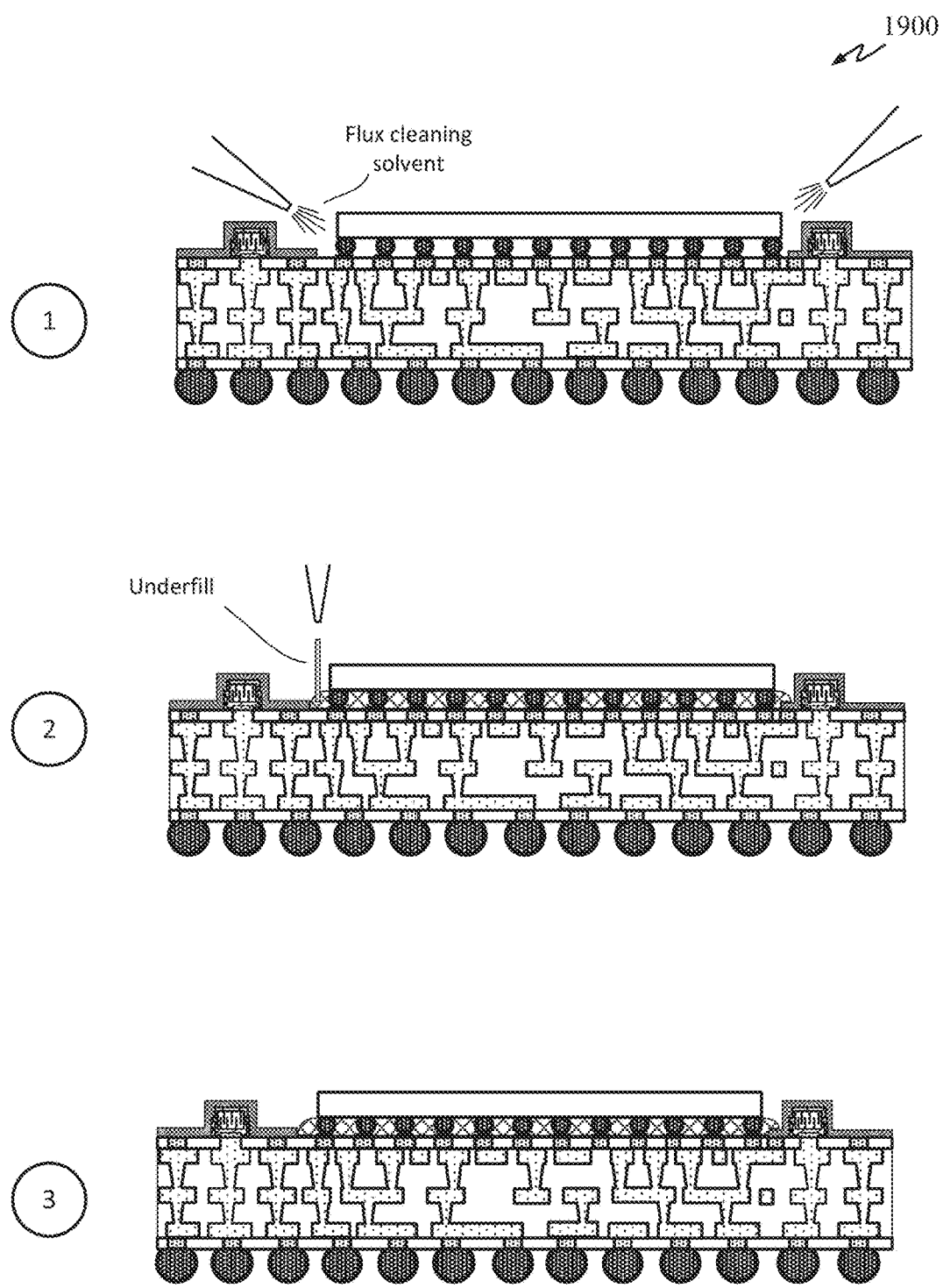
FIG. 19 illustrates a first exemplary process for applying underfill in accordance to one aspect of the disclosure.

FIG. 19 illustrates a process 1900 for applying an underfill layer. At stage 1, the IC die is already mounted to the multilayer coreless substrate. Prior to applying the underfill, the surfaces between the IC and the substrate must be cleaned. As shown, a cleaning solution is sprayed onto the IC package to remove residue flux from the solder reflow process. At stage 2, an underfill dispenser deposit underfill materials as close to the IC-substrate gap as possible and along the IC perimeter. Capillary reaction then pulls in the underfill materials at the perimeter into the center. At stage 3, the underfill is cured and the IC package is completed.

Figure 20:
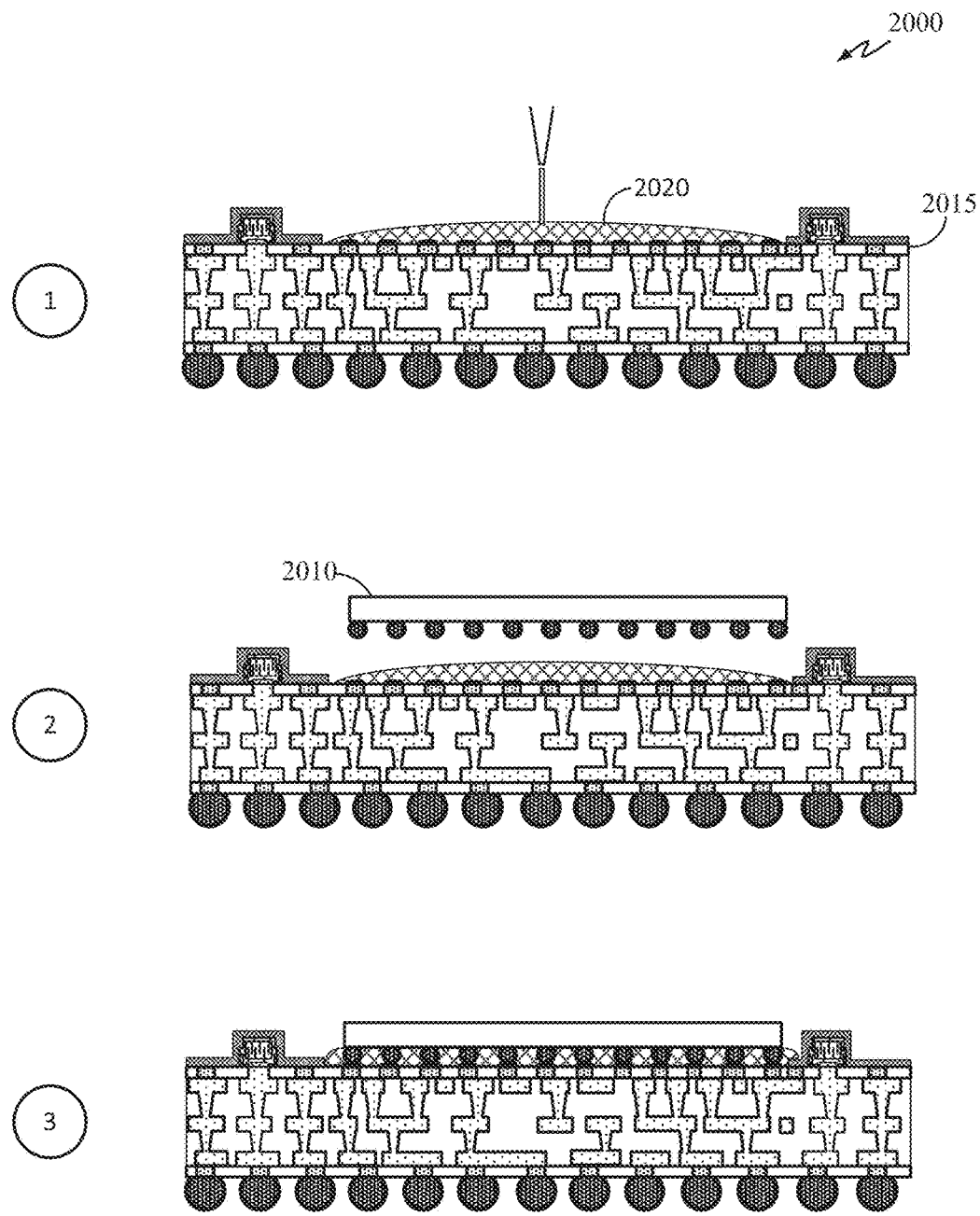
FIG. 20 illustrates a second exemplary process for applying underfill in accordance to one aspect of the disclosure.

FIG. 20 illustrates an alternative process 2000 for applying an underfill. Process 2000 may be used in place of process 1900 for unmounted IC die. At stage 1, underfill materials 2020 are applied to the surface of substrate 2015 prior to mounting an IC die 2010. At stage 2, IC die 2010 is picked and place by a vacuum tip onto substrate 2015. At stage 3, the underfill is cured and the IC package is now complete.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

Process for Fabricating IC Package with a Coreless Substrate, Die Side Vertical Capacitors, and a Conductive Layer.

Figure 21:
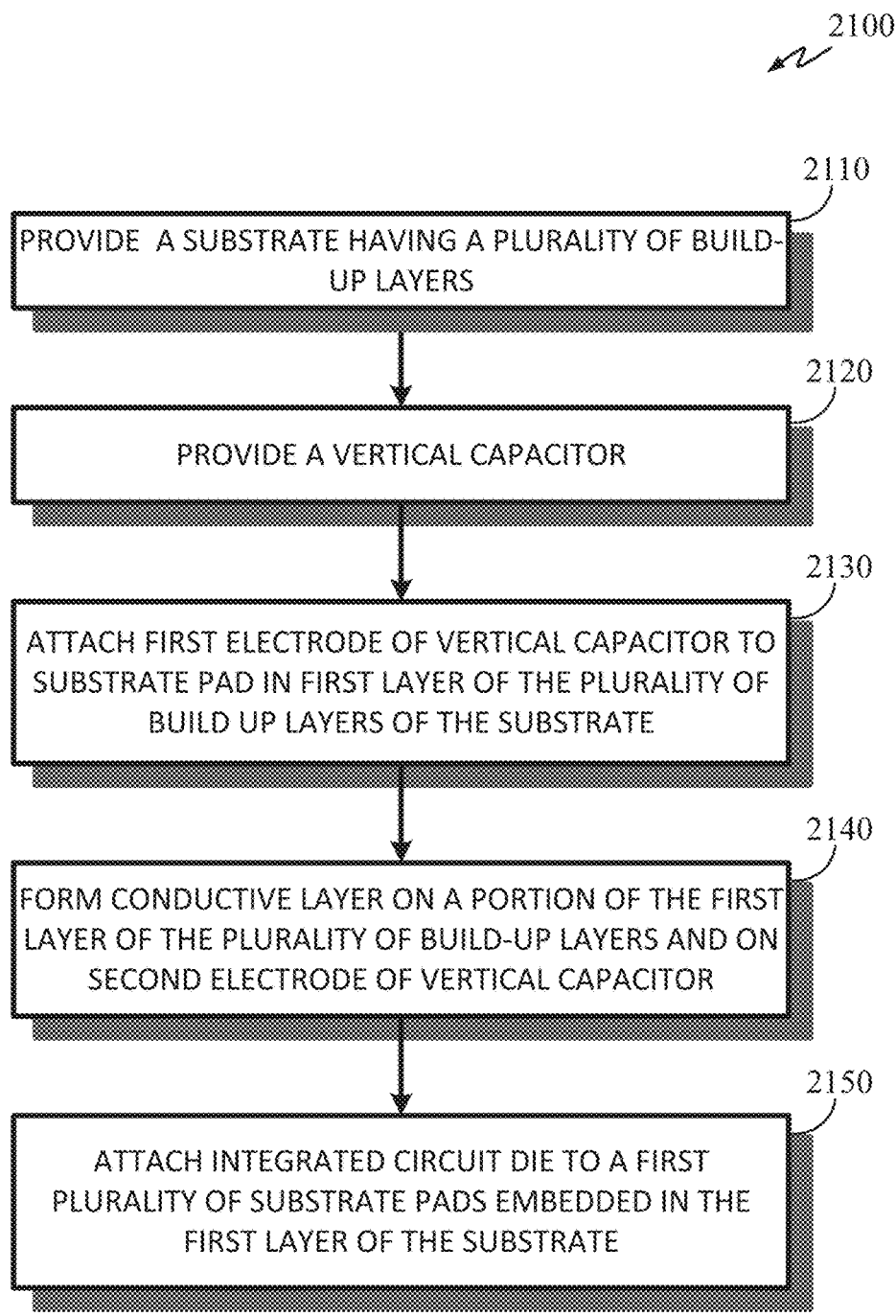
FIG. 21 illustrates a process for fabricating an IC package in accordance to one aspect of the disclosure.

FIG. 21 illustrates a process 2100 for fabricating an IC package in accordance to an aspect of the disclosure. Process 2100 may be used to fabricate any of IC packages 300, 600, 700, and 1000. Process 2100 starts when a substrate having a plurality of build-up layers is provided 2110. The plurality of build-up layers may be a combination of one or more metal layers, prepreg layers, dielectric layers, solder resist layers, and a core layer. In one aspect, the provided build-up substrate may be coreless substrate 315, 615, or 715. In another aspect, the build-up substrate may be a cored substrate to enhance certain mechanical properties such as warpage.

Next, a vertical capacitor is provided 2120. The vertical capacitor may be a multilayer ceramic capacitor having vertical metal layers. In one aspect, the provided decoupling capacitor is similar or identical to capacitor 360 shown in FIG. 4.

The first electrode of the vertical capacitor is then attached to a substrate pad exposed by an opening in the solder resist layer 2130. The first electrode is attached to the substrate in a way such that a common vertical axis of the first and second electrodes is perpendicular to the planar surface of the solder resist layer. In other words, the first and second electrodes are parallel to each other and perpendicular the planar surface of the substrate. In one aspect, the first electrode is coupled to a power source. Alternatively, the first electrode is coupled to ground.

A conductive layer is subsequently formed on a portion of the planar surface of the solder resist layer of the substrate 2140. The conductive layer be formed along the perimeter of the IC package or the substrate's outer perimeter. The conductive layer may be formed such that it exhibits the shape shown in FIGS. 10A and 10B. The conductive layer is also formed on the second electrode of the capacitor such that the entire capacitor is encapsulate by the conductive layer. In one aspect, the conductive layer is coupled to ground. In this aspect, the first electrode of the capacitor is coupled to power. Alternatively, the conductive layer is coupled to a power source and the first electrode is coupled to ground.

Once the conductive layer is formed on the surface of the solder mask (solder resist layer) while also encapsulating the capacitor, the IC die is attached to a plurality of substrate pads exposed by openings in the solder masks 2150. In one aspect, the plurality of substrate pads are further built-up using an additive metallization process in order to thicken the substrate pads.

In one aspect, the IC die is coupled to the build-up substrate before the capacitor is coupled to the substrate and before the conductive layer is formed. In this aspect, the IC die may be coupled to the build-up substrate using one or more processes 1500, 1600, 1700, 1800, 1900, and 2000.

After the IC is coupled, the IC may be masked before the conductive layer is formed using one or more processes 1200 and 1300.

Although process 2100 is described in a flip chip environment, it should be noted that certain aspects of the disclosure described in processes 1200, 1300, 1400, 1500, 1600, 1700, 1800, 1900, 2000, and 2100 and IC packages 300, 600, and 700 are also applicable to other type of chip-to-substrate attachment technologies and IC packages. For example, certain innovative aspects relating to the vertical capacitor and conductive layer (specifically how they are formed and coupled to each other and to the substrate) can be modified to be applicable to wire bond, BGA, μBGA IC packages, etc.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated circuit package comprising:
   a substrate comprising a first plurality of substrate pads;
   an integrated circuit die coupled to the first plurality of substrate pads embedded in a first layer of the substrate;
   a vertical capacitor having a first electrode, a second electrode and a plurality of interleaved vertical metal layers, each interleaved vertical metal layer consisting of a single metal layer, the first electrode coupled to a first substrate pad embedded in the first layer of the substrate; and
   a conductive layer formed over a first surface and the second electrode of the vertical capacitor, the first surface being parallel to a planar surface of the substrate,
   wherein the first surface and the second electrode of the vertical capacitor faces away from the planar surface of the substrate,
   wherein the conductive layer is coupled to a second pad of the substrate,
   wherein the conductive layer encapsulates the vertical capacitor, and wherein the first and second electrodes are parallel to each other.

2. The integrated circuit package of claim 1, wherein the conductive layer is coupled to at least one substrate pad embedded in the first layer of the substrate.

3. The integrated circuit package of claim 2, wherein the conductive layer is coupled to a second and third substrate pads, wherein the second substrate pad is electrically coupled to the integrated circuit die via a conductive trace in a first metal layer.

4. The integrated circuit package of claim 3, wherein the second substrate pad is coupled to a ground or a power plane.

5. The integrated circuit package of claim 1, wherein the substrate comprises:
   a first and a second prepreg layers;
   a first metal layer located on the first prepreg layer, wherein each substrate pad embedded in the first layer of the substrate is formed on the first metal layer, wherein the first layer of the substrate is a solder resist layer;
   a second metal layer located between the first and second prepreg layers;
   a third metal layer located on a surface of the second prepreg layer; and
   a second solder resist layer located on the third metal layer.

6. The integrated circuit package of claim 5, wherein the first and second prepreg layers have a thickness range of 30-60 microns.

7. The integrated circuit package of claim 6, wherein each of the first and second prepreg layers has a different coefficient of thermal expansion (CTE).

8. The integrated circuit package of claim 6, wherein each of the first and second prepreg layers has a thickness of 45 microns.

9. The integrated circuit package of claim 5, wherein the first and second prepreg layers have different thicknesses to reduce warpage, wherein each of the first and second prepreg layer has a thickness range of 30-60 microns.

10. The integrated circuit package of claim 5, further comprising a plurality of bumps formed on the second solder resist layer of the substrate.

11. The integrated circuit package of claim 1, wherein the substrate comprises a plurality of build-up layers, wherein first and second layers of the plurality of build-up layers comprise prepreg layers, wherein each prepreg layer has a thickness range of 30-60 microns.

12. The integrated circuit package of claim 1, wherein the substrate has a thickness range of 160-190 microns.

13. The integrated circuit package of claim 1, wherein the substrate has a thickness of 176 microns.

14. The integrated circuit package of claim 1, wherein the vertical capacitor has a width of 0.5 millimeter and a thickness range of 0.1-0.2 millimeter.

15. The integrated circuit package of claim 1, further comprising a conductive adhesive located between the first electrode of the vertical capacitor and the first substrate pad of the substrate.

16. An integrated circuit package comprising:
    a coreless substrate having a plurality of build-up layers;
    an integrated circuit die coupled to a first plurality of substrate pads embedded in a first layer of the plurality of build-up layers of the substrate;
    a vertical capacitor having first and second electrodes with a common axis being perpendicular to a planar surface of the substrate, the vertical capacitor further having a plurality of interleaved vertical metal layers, each interleaved vertical metal layer consisting of a single metal layer, the first electrode is coupled to a first substrate pad embedded in the first layer of the substrate; and
    a conductive layer formed over a first surface and the second electrode of the vertical capacitor, the first surface being parallel to the planar surface of the substrate,
    wherein the first surface and the second electrode of the vertical capacitor faces away from the planar surface of the substrate,
    wherein the conductive layer is coupled to a second pad of the substrate,
    wherein the conductive layer encapsulates the vertical capacitor,
    wherein the plurality of build-up layers comprises two prepreg layers, and
    wherein each prepreg layer has a thickness range of 30-60 microns.

17. The integrated circuit package of claim 16, wherein each of the prepreg layers has a different coefficient of thermal expansion (CTE).

18. The integrated circuit package of claim 16, wherein the conductive layer is coupled to ground.

* * * * *